United States Patent
Chae et al.

(10) Patent No.: US 10,573,785 B2
(45) Date of Patent: Feb. 25, 2020

(54) LIGHT EMITTING DIODE, METHOD OF FABRICATING THE SAME AND LED MODULE HAVING THE SAME

(71) Applicant: Seoul Viosys Co., Ltd., Ansan-si (KR)

(72) Inventors: Jong Hyeon Chae, Ansan-si (KR); Joon Sup Lee, Ansan-si (KR); Daewoong Suh, Ansan-si (KR); Won Young Roh, Ansan-si (KR); Min Woo Kang, Ansan-si (KR); Jong Min Jang, Ansan-si (KR); Se Hee Oh, Ansan-si (KR); Hyun A Kim, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 130 days.

(21) Appl. No.: 15/838,264

(22) Filed: Dec. 11, 2017

(65) Prior Publication Data

US 2018/0114879 A1 Apr. 26, 2018

Related U.S. Application Data

(63) Continuation of application No. 14/985,162, filed on Dec. 30, 2015, now Pat. No. 9,847,457, which is a
(Continued)

(30) Foreign Application Priority Data

Jul. 29, 2013 (KR) .................. 10-2013-0089414
Jul. 29, 2013 (KR) .................. 10-2013-0089415
(Continued)

(51) Int. Cl.
H01L 33/38 (2010.01)
H01L 29/40 (2006.01)
(Continued)

(52) U.S. Cl.
CPC .............. *H01L 33/38* (2013.01); *H01L 33/40* (2013.01); *H01L 33/405* (2013.01); *H01L 33/44* (2013.01); *H01L 2224/16225* (2013.01)

(58) Field of Classification Search
CPC .... H01L 21/316; H01L 21/768; H01L 23/522
(Continued)

(56) References Cited

U.S. PATENT DOCUMENTS 6,199,484 B1 3/2001 Martinez-Tovar et al.
6,215,251 B1 4/2001 Orchard-Webb
(Continued)

FOREIGN PATENT DOCUMENTS

JP 2010-267834 A 11/2010
KR 20120027318 A 3/2012

OTHER PUBLICATIONS

Park, Hye Lyun, Authorized Officer, Korean Intellectual Property Office, Written Opinion, International Application No. PCT/KR2014/006904, dated Nov. 20, 2014, 7 pages.
(Continued)

*Primary Examiner* — Sheikh Maruf
(74) *Attorney, Agent, or Firm* — Perkins Coie LLP

(57) ABSTRACT

A light emitting diode is provided to include a first conductive-type semiconductor layer; a mesa including a second conductive-type semiconductor layer disposed on the first conductive-type semiconductor layer and an active layer interposed between the first and the second conductive-type semiconductor layers; and a first electrode disposed on the mesa, wherein the first conductive-type semiconductor layer includes a first contact region disposed around the mesa along an outer periphery of the first conductive-type semiconductor layer; and a second contact region at least partially surrounded by the mesa, the first electrode is electrically connected to at least a portion of the first contact region
(Continued)

and at least a portion of the second contact region, and a linewidth of an adjoining region between the first contact region and the first electrode is greater than the linewidth of an adjoining region between the second contact region and the first electrode.

18 Claims, 25 Drawing Sheets

Related U.S. Application Data continuation-in-part of application No. 14/848,232, filed as application No. PCT/KR2014/006904 on Jul. 29, 2014, now Pat. No. 9,640,719.

(30) Foreign Application Priority Data

Dec. 31, 2014 (KR) ........................ 10-2014-0195162
Nov. 25, 2015 (KR) ........................ 10-2015-0165706

(51) Int. Cl.
*H01L 33/44* (2010.01)
*H01L 33/40* (2010.01)

(58) Field of Classification Search
USPC ........ 257/741, 773, 774, 459, 211; 438/612, 438/622, 396, 381, 733
See application file for complete search history.

(56) References Cited

U.S. PATENT DOCUMENTS

| | | |
|---|---|---|
| 2007/0018186 A1 | 1/2007 | Shin |
| 2007/0096077 A1 | 5/2007 | Sanga |
| 2008/0013329 A1 | 1/2008 | Takeda |
| 2008/0185606 A1 | 8/2008 | Sano |
| 2008/0303018 A1 | 12/2008 | Kim |
| 2009/0098676 A1 | 4/2009 | Soejima et al. |
| 2009/0283787 A1 | 11/2009 | Donofrio et al. |
| 2010/0213469 A1 | 8/2010 | Locke |
| 2011/0284908 A1 | 11/2011 | Muramoto |
| 2012/0299051 A1 | 11/2012 | Jeong |
| 2013/0032820 A1 | 2/2013 | Wirth |
| 2013/0105845 A1 | 5/2013 | Kim |
| 2013/0214320 A1 | 8/2013 | Onishi |
| 2014/0361327 A1 | 12/2014 | Chae |
| 2015/0108525 A1* | 4/2015 | Chae ....................... H01L 33/38 257/98 |
| 2015/0129915 A1 | 5/2015 | Lee |
| 2015/0171298 A1* | 6/2015 | Cho ....................... H01L 33/38 257/98 |
| 2015/0179890 A1* | 6/2015 | Sano ....................... H01L 33/38 257/98 |
| 2015/0207051 A1 | 7/2015 | Yoon |
| 2015/0270442 A1 | 9/2015 | Chae |
| 2015/0280086 A1* | 10/2015 | Jang ....................... H01L 33/405 257/88 |
| 2015/0372208 A1 | 12/2015 | Chae |
| 2016/0111600 A1 | 4/2016 | Chae et al. |
| 2016/0190400 A1 | 6/2016 | Jung |
| 2016/0197242 A1 | 7/2016 | Tsai |
| 2017/0186914 A1* | 6/2017 | Kitahama ............... H01L 33/38 |
| 2018/0040767 A1* | 2/2018 | Jang ....................... H01L 33/10 |
| 2018/0261723 A1* | 9/2018 | Jang ..................... H01L 33/007 |

OTHER PUBLICATIONS

English Translation of Korean Office Action from related Korean Patent Application No. 10-2013-0089414 dated May 27, 2019 (6 pages).

* cited by examiner (a)

(b)

(c)

(a)

(b)

(c)

(a)

(b)

(c)

(a)

(b)

(c)

(a)

(b)

(c)

(a)

(b)

(c)

(a)

(b)

(c)

(a)

(b)

(b)

(a)

(b)

(b)

United States Patent US 10,573,785 B2

LIGHT EMITTING DIODE, METHOD OF FABRICATING THE SAME AND LED MODULE HAVING THE SAME

CROSS REFERENCE TO RELATED APPLICATION

This patent document is a continuation of, and claims the benefits and priority to, U.S. patent application Ser. No. 14/985,162, filed on Dec. 30, 2015, which is a continuation-in-part of U.S. patent application Ser. No. 14/848,232, filed on Sep. 8, 2015, which claims the benefits and priorities to International Application No. PCT/KR2014/006904, filed on Jul. 29, 2014, which further claims priorities from and the benefits of Korean Patent Application No. 10-2013-0089414, filed on Jul. 29, 2013, and Korean Patent Application No. 10-2013-0089415, filed on Jul. 29, 2013. This patent document also claims the benefits and priorities to Korean Patent Application No. 10-2014-0195162, filed on Dec. 31, 2014, and Korean Patent Application No. 10-2015-0165706, filed on Nov. 25, 2015. The above applications are all hereby incorporated by reference for all purposes as if fully set forth herein.

TECHNICAL FIELD

Exemplary embodiments of the disclosed technology relate to a light emitting diode (LED), an LED module including the same, and a method of fabricating the same. For example, some implementations of the disclosed technology relates to a light emitting diode having improved reliability, an LED module including the same, and a method of fabricating the same.

BACKGROUND

Since GaN-based light emitting diodes were first developed, GaN-based LEDs have been used for various applications including natural color LED displays, LED traffic signboards, white LEDs, and the like.

Generally, a GaN-based light emitting diode is formed by growing epitaxial layers on a substrate such as a sapphire substrate, and includes an N-type semiconductor layer, a P-type semiconductor layer and an active layer interposed therebetween. In addition, an n-electrode pad is formed on the N-type semiconductor layer and a p-electrode pad is formed on the P-type semiconductor layer. The light emitting diode is connected to an external power source through the electrode pads and driven thereby. In this case, current flows from the p-electrode pad to the n-electrode pad through the semiconductor layers.

On the other hand, a flip-chip type light emitting diode is used to prevent light loss due to the p-electrode pad while improving heat dissipation efficiency, and various electrode structures are proposed to promote current spreading in a large area flip-chip type light emitting diode. Examples are disclosed in U.S. Pat. No. 6,486,499. For example, a reflective electrode is formed on the P-type semiconductor layer, and extension legs are formed on a region of the N-type semiconductor layer, which is exposed by etching the P-type semiconductor layer and the active layer, to facilitate current spreading.

The reflective electrode formed on the P-type semiconductor layer reflects light generated from the active layer to improve light extraction efficiency and helps current spreading in the P-type semiconductor layer. On the other hand, the extension legs connected to the N-type semiconductor layer help current spreading in the N-type semiconductor layer to allow uniform generation of light in a wide active region. Particularly, a light emitting diode having a large area of about 1 $mm^2$ and used for high power output requires current spreading not only in the P-type semiconductor layer but also in the N-type semiconductor layer.

On the other hand, a forward voltage Vf is supplied to the light emitting diode to generate light, and a light emitting diode having good luminous efficacy refers to a light emitting diode capable of emitting the same intensity of light at a lower forward voltage. Therefore, various attempts have been made to decrease forward voltage of the light emitting diode.

On the other hand, in a process of dicing light emitting diodes on a wafer into individual light emitting diodes, an insulation layer exposed to a plane to be cut is likely to suffer from cracks. Such cracks can propagate into the light emitting diode. Moreover, interlayer delamination occurs due to cracks, thereby causing delamination of the insulation layer from semiconductor layers. Accordingly, moisture and contaminants can infiltrate the light emitting diode along an interface between the insulation layer and a semiconductor layer, thereby contaminating the light emitting diode, and delamination force with respect to layers in the light emitting diode can be reduced, thereby causing deterioration in reliability of the light emitting diode.

SUMMARY

Exemplary embodiments of the disclosed technology provide a light emitting diode chip having an electrostatic discharge protection function.

In addition, exemplary embodiments of the disclosed technology provide a light emitting diode which can be directly mounted on a printed circuit board or the like using a solder paste by preventing diffusion of metal elements from the solder paste.

Further, exemplary embodiments of the disclosed technology provide a light emitting diode having improved current spreading performance.

Furthermore, exemplary embodiments of the disclosed technology provide a light emitting diode having improved light extraction efficiency by improving reflectivity.

Furthermore, exemplary embodiments of the disclosed technology provide a light emitting diode a having low forward voltage.

Furthermore, exemplary embodiments of the disclosed technology provide a light emitting diode capable of simplifying a manufacturing process by reducing the use of photomasks, an LED module including the same, and a method of fabricating the same.

Furthermore, exemplary embodiments of the disclosed technology provide a light emitting diode having improved reliability and luminous efficacy by preventing damage to the light emitting diode due to cracks.

Additional features of the disclosed technology will be set forth in the description which follows, and in part will become apparent from the description, or may be learned from practice of the disclosed technology.

In one aspect, a light emitting diode includes: a first conductive-type semiconductor layer; a second conductive-type semiconductor layer; an active layer interposed between the first conductive-type semiconductor layer and the second conductive-type semiconductor layer; a first electrode pad region electrically connected to the first conductive-type semiconductor layer; a second electrode pad region electrically connected to the second conductive-type semiconductor layer; and a spark gap formed between a first leading end electrically connected to the first electrode pad region and a second leading end electrically connected to the second electrode pad region. The spark gap can achieve electrostatic discharge protection of the light emitting diode.

In some implementations, the light emitting diode may further include an upper insulation layer covering the second conductive-type semiconductor layer, the upper insulation layer including an opening that exposes the spark gap. As the spark gap is exposed to the outside, it is possible to prevent generation of static electricity by electrical sparks via air.

In some implementations, the light emitting diode may include a mesa placed on the first conductive-type semiconductor layer, the mesa including the active layer and the second conductive-type semiconductor layer, and the first electrode pad region may be electrically connected to the first conductive-type semiconductor layer at a side of the mesa.

In some implementations, the light emitting diode may further include a reflective electrode structure placed on the mesa; and a current spreading layer covering the mesa and the first conductive-type semiconductor layer, and having an opening that exposes the reflective electrode structure, the current spreading layer being electrically connected to the first conductive-type semiconductor layer while being insulated from the reflective electrode structure and the mesa, wherein the upper insulation layer covers the current spreading layer and the first leading end may be a portion of the current spreading layer.

In some implementations, the light emitting diode may further include an anti-diffusion reinforcing layer placed on the reflective electrode structure in the opening of the current spreading layer, wherein the second leading end may be a portion of the anti-diffusion reinforcing layer. In some implementations, the anti-diffusion reinforcing layer may be formed of the same material as that of the current spreading layer.

In some implementations, the upper insulation layer may include a first opening that exposes the current spreading layer to define the first electrode pad region, and a second opening that exposes the anti-diffusion reinforcing layer to define the second electrode pad region.

In some implementations, the light emitting diode may further include a lower insulation layer placed between the mesa and the current spreading layer and insulating the current spreading layer from the mesa, the lower insulation layer having an opening placed in an upper region of the mesa and exposing the reflective electrode structure.

In some implementations, the spark gap may be placed between the first electrode pad region and the second electrode pad region. The spark gap generates electric sparks when static electricity of high voltage is applied between the first electrode pad region and the second electrode pad region. To this end, a gap between the first leading end and the second leading end may be narrower than other portions. In some implementations, the first leading end and the second leading end may have a semi-circular or angled shape and face each other.

In another aspect, a method of fabricating a light emitting diode is provided to include: forming a first conductive-type semiconductor layer, an active layer and a second conductive-type semiconductor layer on a substrate; patterning the second conductive-type semiconductor layer and the active layer to form a mesa on the first conductive-type semiconductor layer; and forming a first electrode pad region electrically connected to the first conductive-type semiconductor layer and a second electrode pad region electrically connected to the second conductive-type semiconductor layer. Furthermore, the light emitting diode has a spark gap defined between the first leading end electrically connected to the first electrode pad region and the second leading end electrically connected to the second electrode pad region.

In some implementations, the method may further include: forming a reflective electrode structure on the second conductive-type semiconductor layer; and forming a current spreading layer covering the mesa and the first conductive-type semiconductor layer, and having an opening exposing the reflective electrode structure, the current spreading layer forming ohmic contact with the first conductive-type semiconductor layer while being insulated from the mesa, wherein the first leading end is a portion of the current spreading layer.

The current spreading layer allows uniform spreading of current in the first conductive-type semiconductor layer. The first leading end may be a portion of the current spreading layer.

In some implementations, the method may further include forming an anti-diffusion reinforcing layer on the reflective electrode structure, the anti-diffusion reinforcing layer being formed together with the current spreading layer, wherein the second leading end is a portion of the anti-diffusion reinforcing layer. Thus, the first and second leading ends can be formed together with the current spreading layer and the anti-diffusion reinforcing layer by the same process.

In some implementations, the method may further include forming an upper insulation layer covering the current spreading layer, the upper insulation layer having a first opening exposing the current spreading layer to define the first electrode pad region, and a second opening exposing the anti-diffusion reinforcing layer to define the second electrode pad region.

In some implementations, the upper insulation layer may further include an opening through which the first leading end and the second leading end are exposed. The opening may be distant from the first and second openings.

In some implementations, the method may further include forming a lower insulation layer covering the mesa and the first conductive-type semiconductor layer, before forming the current spreading layer, the lower insulation layer having openings that expose the reflective electrode structure and the first conductive-type semiconductor layer.

In some implementations, the lower insulation layer may include a silicon oxide layer and the upper insulation layer may include a silicon nitride layer.

In some implementations, the method may further include forming an anti-Sn diffusion plating layer on the first electrode pad region and the second electrode pad region using a plating technique.

In another aspect, a light emitting diode (LED) module is provided to comprise: a printed circuit board; and a light emitting diode bonded to an upper side of the printed circuit board, the light emitting diode comprising: a first conductive-type semiconductor layer; a mesa placed on the first conductive-type semiconductor layer and including an active layer and a second conductive-type semiconductor layer; a reflective electrode structure placed on the mesa; a current spreading layer covering the mesa and the first conductive-type semiconductor layer, and having an opening that exposes the reflective electrode structure, the current spreading layer being electrically connected to the first conductive-type semiconductor layer while being insulated from the reflective electrode structure and the mesa; and an upper insulation layer covering the current spreading layer, the upper insulation layer has a first opening exposing the current spreading layer to define the first electrode pad region, and a second opening exposing an exposed upper region of the reflective electrode structure to define the second electrode pad region, wherein the first electrode pad region and the second electrode pad region are bonded to corresponding pads on the printed circuit boards via solder pastes, respectively.

Since the first and second electrode pad regions are respectively defined by the first and second openings of the upper insulation layer, there is no need for a separate photomask for forming the first and second electrode pads.

In some implementations, the light emitting diode may further include an anti-Sn diffusion plating layer formed on the first electrode pad region and the second electrode pad region.

Unlike typical AuSn solders in the related art, the solder paste is a mixture of a metal alloy and an organic material and is cured by heat treatment to provide a bonding function. Thus, metal elements such as Sn in the solder paste are unlikely to diffuse, unlike metal elements in the typical AuSn solders in the related art.

The anti-Sn diffusion plating layer can prevent the metal elements such as Sn in the solder paste from diffusing into the light emitting diode. Furthermore, as the anti-Sn diffusion plating layer is formed by a plating technique such as electroless plating, there is no need for a separate photomask for formation of the plating layer.

In some embodiments, the light emitting diode may further include an anti-diffusion reinforcing layer placed on the reflective electrode structure in the opening of the current spreading layer, the anti-diffusion reinforcing layer being exposed through the second opening of the upper insulation layer. The anti-diffusion reinforcing layer can prevent metal elements such as Sn in the solder paste from diffusing to the reflective electrode structure in the light emitting diode.

In some implementations, the anti-diffusion reinforcing layer may be formed of the same material as that of the current spreading layer.

Thus, the anti-diffusion reinforcing layer may be formed together with the current spreading layer, and there is no need for a separate photomask for formation of the anti-diffusion reinforcing layer.

In some implementations, the current spreading layer may include an ohmic contact layer, a reflective metal layer, an anti-diffusion layer, and an anti-oxidation layer. In some implementations, the current spreading layer may form ohmic contact with the first conductive-type semiconductor layer through the ohmic contact layer. For example, the ohmic contact layer may be formed of Ti, Cr, Ni, and the like.

The reflective metal layer reflects light incident on the current spreading layer to increase reflectivity of the light emitting diode. The reflective metal layer may be formed of Al. In addition, the anti-diffusion layer prevents diffusion of metal elements and serves to protect the reflective metal layer. For example, the anti-diffusion layer can prevent diffusion of metal elements such as Sn in the solder paste. In some implementations, the anti-diffusion layer may include Cr, Ti, Ni, Mo, TiW, or W or combinations thereof. Each of Mo, TiW and W may be used to form a single layer. On the other hand, Cr, Ti, and Ni may be used to form a pair of layers.

In some implementations, the anti-diffusion layer may include at least two pairs of Ti/Ni or Ti/Cr layers. In some implementations, the anti-oxidation layer is formed to prevent oxidation of the anti-diffusion layer and may include Au.

In some implementations, the current spreading layer may have a reflectivity of 65% to 75%. Thus, the light emitting diode according to this embodiment of the invention can provide optical reflection by the current spreading layer in addition to optical reflection by the reflective electrode structure, whereby light traveling through a sidewall of the mesa and the first conductive-type semiconductor layer can be reflected.

In some implementations, the current spreading layer may further include a bonding layer placed on the anti-oxidation layer. In some implementations, the bonding layer may include Ti, Cr, Ni or Ta. The bonding layer is used to enhance bonding strength between the current spreading layer and the upper insulation layer.

In some implementations, the solder paste may adjoin the current spreading layer and the anti-diffusion reinforcing layer. Alternatively, the solder paste may adjoin the anti-Sn diffusion plating layer formed on the current spreading layer and the anti-diffusion reinforcing layer.

In some implementations, the reflective electrode structure may include a reflective metal section; a capping metal section; and an anti-oxidation metal section, the reflective metal section having a slanted side surface such that an upper surface of the reflective metal section has a narrower area than a lower surface thereof, and wherein a stress relief layer is formed at an interface between the reflective metal section and the capping metal section. The stress relief layer relieves stress due to a difference in coefficient of thermal expansion between the metal layers formed of different materials.

In some implementations, the mesa may include elongated branches extending parallel to each other in one direction, and a connecting portion at which the branches are connected to each other, and the opening of the current spreading layer may be placed on the connecting portion.

In some implementations, the light emitting diode may further include a lower insulation layer placed between the mesa and the current spreading layer and insulating the current spreading layer from the mesa, the lower insulation layer has an opening that is placed in an upper region of the mesa and exposes the reflective electrode structure.

In some implementations, the opening of the current spreading layer may have a greater width than the opening of the lower insulation layer such that the opening of the lower insulation layer is completely exposed therethrough. As a result, the current spreading layer can be insulated from the reflective electrode structure.

In some implementations, the light emitting diode may further include an anti-diffusion reinforcing layer placed within the opening of the current spreading layer and the opening of the lower insulation layer, and the anti-diffusion reinforcing layer may be exposed through the second opening of the upper insulation layer.

In some implementations, the lower insulation layer may include a silicon oxide layer and the upper insulation layer may include a silicon nitride layer. As the upper insulation layer is formed of silicon nitride, it is possible to prevent diffusion of metal elements from the solder paste through the upper insulation layer.

In some implementations, the solder paste may include lead-free solder alloys, for example, Sn—Ag alloys, Sn—Bi alloys, Sn—Zn alloys, or Sn—Ag—Cu alloys.

The light emitting diode may further include a substrate and a wavelength conversion layer covering a lower surface of the substrate. The substrate may be a growth substrate for growing the semiconductor layers. In addition, the wavelength conversion layer may cover the lower surface and a side surface of the substrate.

In another aspect, a light emitting diode is provided to comprise: a first conductive-type semiconductor layer; a mesa disposed on the first conductive-type semiconductor layer and comprising an active layer and a second conductive-type semiconductor layer; a reflective electrode structure disposed on the mesa; a current spreading layer covering the mesa and the first conductive-type semiconductor layer, and having an opening exposing the reflective electrode structure, the current spreading layer being electrically connected to the first conductive-type semiconductor layer while being insulated from the reflective electrode structure and the mesa; and an upper insulation layer covering the current spreading layer, the upper insulation layer having a first opening exposing the current spreading layer to define a first electrode pad region, and a second opening exposing an exposed upper region of the reflective electrode structure to define the second electrode pad region.

In some implementations, the light emitting diode further comprises: an anti-diffusion reinforcing layer disposed on the reflective electrode structure in the opening of the current spreading layer, wherein the anti-diffusion reinforcing layer is exposed through the second opening of the upper insulation layer, and is formed of the same material as that of the current spreading layer. In some implementations, the light emitting diode further comprises: anti-solder diffusion layers formed in the first opening and the second opening. In some implementations, the current spreading layer comprises an ohmic contact layer, a reflective metal layer, an anti-diffusion layer, and an anti-oxidation layer.

In another aspect, a method of fabricating a light emitting diode is provided. The method may include: forming a first conductive-type semiconductor layer, an active layer and a second conductive-type semiconductor layer on a substrate; patterning the second conductive-type semiconductor layer and the active layer to form a mesa on the first conductive-type semiconductor layer while forming a reflective electrode structure on the mesa to form ohmic contact with the mesa; forming a current spreading layer covering the mesa and the first conductive-type semiconductor layer, and having an opening that exposes the reflective electrode structure, the current spreading layer forming ohmic contact with the first conductive-type semiconductor layer while being insulated from the mesa; and forming an upper insulation layer covering the current spreading layer, the upper insulation layer having a first opening exposing the current spreading layer to define a first electrode pad region, and a second opening exposing an exposed upper region of the reflective electrode structure to define the second electrode pad region.

In the fabrication method, since there is no need for formation of electrode pads on the upper insulation layer, it is possible to reduce the number of photomasks for fabrication of the light emitting diode.

In some implementations, the method may further include forming an anti-diffusion reinforcing layer on the reflective electrode structure, wherein the anti-diffusion reinforcing layer can be formed together with the current spreading layer, and the second opening of the upper insulation layer can expose the anti-diffusion reinforcing layer. Accordingly, the reflective electrode structure can be concealed and protected by the anti-diffusion reinforcing layer and the upper insulation layer.

In some implementations, the method may further include forming a lower insulation layer covering the mesa and the first conductive-type semiconductor layer, before forming the current spreading layer; dividing the lower insulation layer and the first conductive-type semiconductor layer into chip regions by laser scribing; and patterning the lower insulation layer to form openings exposing the first conductive-type semiconductor layer and an opening exposing the reflective electrode structure.

Since a chip isolation region is formed using laser scribing, there is no need for use of a photomask. In addition, since laser scribing is performed after formation of the lower insulation layer, particles formed in the laser scribing process can be easily removed by cleaning the lower insulation layer, whereby the light emitting diode can be prevented from being contaminated by the particles.

In some implementations, the lower insulation layer may include a silicon oxide layer and the upper insulation layer may include a silicon nitride layer.

In some implementations, the method may further include forming an anti-Sn diffusion plating layer on the first electrode pad region and the second electrode pad region using a plating technique. The plating layer may be formed by electroless plating such as ENIG (electroless nickel immersion gold) and the like.

In some implementations, the substrate may be partially removed to have a small thickness by grinding and/or lapping. Then, the substrate is separated from the chip isolation region formed by laser scribing, thereby providing final individual chips separated from each other. Next, a wavelength conversion layer may be coated onto the light emitting diode chips, and the light emitting diode having the wavelength conversion layer is mounted on a printed circuit board via a solder paste, thereby providing an LED module.

The wavelength conversion layer may be formed by coating a phosphor-containing resin, followed by curing the resin. Alternatively, the wavelength conversion layer may be formed by spraying phosphor powder onto the light emitting diode chip using an aerosol apparatus.

In another aspect, a light emitting diode is provided to include: a first conductive-type semiconductor layer; a mesa including a second conductive-type semiconductor layer disposed over the first conductive-type semiconductor layer and an active layer interposed between the second conductive-type semiconductor layer and the first conductive-type semiconductor layer; and a first electrode disposed over the mesa, wherein the first conductive-type semiconductor layer includes a first contact region disposed around the mesa along an outer periphery of the first conductive-type semiconductor layer; and a second contact region at least partially surrounded by the mesa, the first electrode is electrically connected to at least a portion of the first contact region and at least a portion of the second contact region, and a linewidth of an adjoining region between the first contact region and the first electrode is greater than the linewidth of an adjoining region between the second contact region and the first electrode. With the structure wherein a contact area between the first electrode and the first conductive-type semiconductor layer through the first contact region is relatively increased as compared with a contact area between the first electrode and the first conductive-type semiconductor layer through the second contact region, the light emitting diode can have a reduced forward voltage (Vf). Furthermore, the light emitting diode can have improved luminous efficacy by more effectively spreading electric current in the horizontal direction.

In some implementations, the second contact region may be electrically connected to the first contact region. With this structure, the light emitting diode can have improved luminous efficacy by more effectively spreading electric current in the horizontal direction.

In some implementations, a length of the second contact region in a major axis direction may be 0.5 times or more the length of one side of the light emitting diode. With this structure, a contact area between the first electrode and the first conductive-type semiconductor layer can be increased, such that electric current flowing from the first electrode to the first conductive-type semiconductor layer can be more effectively dispersed, thereby further reducing forward voltage.

In some implementations, the linewidth of the adjoining region between the first contact region and the first electrode may be greater than 10 μm and the linewidth of the adjoining region between the second contact region and the first electrode may be 10 μm or less.

In some implementations, the light emitting diode may further include a first insulation layer interposed between the first electrode and the mesa, and the first insulation layer may partially expose the first contact region and the second contact region.

In some implementations, the first insulation layer may be restrictively disposed closer to the mesa than the adjoining region between the first contact region and the first electrode. With this structure, it is possible to increase the contact area between the first electrode and the first conductive-type semiconductor layer without decreasing a light emitting area. Furthermore, in a process of dicing light emitting diodes of a wafer into individual light emitting diodes, it is possible to prevent the first insulation layer disposed along the outer periphery of the first conductive-type semiconductor layer from suffering from cracking. Accordingly, it is possible to prevent delamination force of the first electrode or a second insulation layer described below from weakening due to infiltration of moisture or contaminants through the cracks, and to prevent contamination of the first electrode, thereby improving reliability of the light emitting diode.

In some implementations, the first electrode may contact the first contact region and the second contact region that are exposed through the first insulation layer while exposing an outer periphery of the first contact region.

In some implementations, a portion of the first conductive-type semiconductor layer not disposed under the first insulation layer may have a smaller thickness than a portion of the first conductive-type semiconductor layer disposed under the first insulation layer. A portion of an upper surface of the first conductive-type semiconductor layer is removed by etching, so that inert particles causing deterioration in conductivity and adhesion can be removed.

In some implementations, the first insulation layer disposed on an upper surface of the second conductive-type semiconductor layer may have the same thickness as the first insulation layer disposed on the upper surface of the first conductive-type semiconductor layer. Accordingly, it is possible to prevent infiltration of external contaminants into a lateral side of the mesa.

In some implementations, the light emitting diode may further include a second insulation layer covering the first electrode and the second contact region exposed through the first electrode.

In some implementations, the first electrode includes a plurality of layers, and an upper portion of the first electrode contacting the second insulation layer may include a Ti layer. With this structure, the light emitting diode has improved reliability through improvement in bonding strength between the first electrode and the second insulation layer.

In some implementations, the second insulation layer may include an opening exposing the first electrode, and an upper portion of the first electrode exposed through the opening of the second insulation layer may include an Au layer.

In some implementations, the light emitting diode may further include a first pad contacting the first electrode, wherein the first pad may contact the exposed Au layer. With this structure, the light emitting diode can exhibit improved bonding strength between the first pad and the first electrode and can reduce resistance.

In some implementations, the light emitting diode may further include a second electrode disposed on the second conductive-type semiconductor layer and electrically connected to the second conductive-type semiconductor layer, wherein the second electrode may be insulated from the first electrode by the first insulation layer.

In some implementations, a portion of the first insulation layer disposed on an upper surface of the second electrode may have a smaller thickness than a portion of the first insulation layer disposed on the upper surface of the second conductive-type semiconductor layer.

In some implementations, the second electrode includes a plurality of layers, and an upper portion of the second electrode contacting the first insulation layer may be a Ti layer. With this structure, the light emitting diode has improved bonding strength between the second electrode and the first insulation layer, thereby providing improved reliability.

In some implementations, the first insulation layer may include an opening exposing the second electrode, and an upper portion of the second electrode exposed through the opening of the first insulation layer may include an Au layer.

In some implementations, the light emitting diode may further include a second pad contacting the second electrode, and the second pad may contact the exposed Au layer. With this structure, the light emitting diode can exhibit improved bonding strength between the second pad and the second electrode and can reduce resistance.

In some implementations, the light emitting diode may further include a growth substrate disposed under the first conductive-type semiconductor layer.

In some implementations, the second insulation layer may cover an overall region of a side surface of the first conductive-type semiconductor layer and a portion of a side surface of the growth substrate. With this structure, the light emitting diode can protect the first conductive-type semiconductor layer from external moisture or impact, and can prevent an interface between the growth substrate and the first conductive-type semiconductor layer from splitting, thereby improving reliability.

In some implementations, the growth substrate may include at least one reformed region having a stripe shape and extending from at least one side surface of the growth substrate in a horizontal direction thereof. With this structure, the light emitting diode can have improved efficiency in extraction of light generated from the active layer.

In some implementations, the second insulation layer may be separated from the outer periphery of the first conductive-type semiconductor layer by a predetermined distance. Accordingly, it is possible to minimize damage to the second insulation layer in a process of dividing the wafer into individual light emitting diodes.

In some implementations, the mesa may include a plurality of protrusions protruding towards one side of the first conductive-type semiconductor layer; and a plurality of protrusions protruding towards the other side of the first conductive-type semiconductor layer. With this structure, not only in a region adjacent the one side of the first conductive-type semiconductor layer but also in a region adjacent the other side of the first conductive-type semiconductor layer, the light emitting diode can achieve efficient current flow between the second electrode disposed on the protrusions and the first electrode disposed on the second contact region. Accordingly, the region adjacent the other side of the first conductive-type semiconductor layer has improved luminous efficacy.

According to embodiments of the disclosed technology, it is possible to protect light emitting diodes from static electricity by forming a spark gap. In addition, some implementations of the disclosed technology provide a light emitting diode, which can prevent diffusion of metal elements from a solder paste, and a method for fabricating the same. Further, some implementations of the disclosed technology provide a light emitting diode having improved current spreading performance, for example, a flip-chip type light emitting diode having improved current spreading performance. Furthermore, the light emitting diodes according to some implementations of the disclosed technology have improved reflectivity by forming a current spreading layer, thereby providing improved light extraction efficiency. Furthermore, the light emitting diodes according to some implementations of the disclosed technology can omit a photolithography process for formation of electrode pads, and can reduce the number of photomasks by forming a chip isolation region using a laser scribing technique. Furthermore, electric current flowing from the first electrode to the first conductive-type semiconductor layer can efficiently spread, thereby reducing a forward voltage. Furthermore, the first electrode can be prevented from being contaminated due to cracks in the first insulation layer, thereby improving reliability of the light emitting diode.

DETAILED DESCRIPTION

Figure 1:
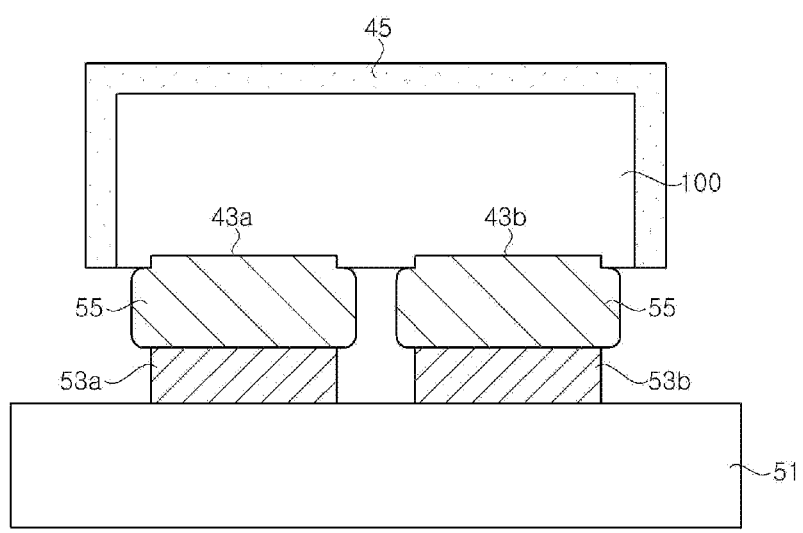
FIG. 1 is a schematic sectional view of an exemplary LED module in accordance with an embodiment of the disclosed technology.

In the related art, the light emitting diode employs linear extension legs which have high resistance, which results in imposing some limit on current spreading. Moreover, since the reflective electrode is placed only on the P-type semiconductor layer, a substantial amount of light is absorbed by the electrode pads and extension legs while not being reflected by the reflective electrode and thus, substantial light loss is caused. When used in a final product, the light emitting diode is provided by an LED module. The LED module generally includes a printed circuit board and an LED package mounted on the printed circuit board, in which the light emitting diode is mounted in chip form within the LED package. A typical LED chip is packaged after being mounted on a sub-mount, a lead frame or a lead electrode by silver pastes or AuSn solders. Then, the LED package is mounted on the printed circuit board by solder pates. As a result, pads on the LED chip are distant from the solder pastes, and bonded to the printed circuit board by a relatively stable bonding material such as silver pastes, AuSn, and the like.

Recently, various attempts have been made to fabricate an LED module by directly bonding electrode pads of a light emitting diode to a printed circuit board using solder pastes. For example, an LED module can be fabricated by directly mounting an LED chip on a printed circuit board instead of packaging the LED chip. Otherwise, an LED module can be fabricated by mounting a so-called wafer level LED package on a printed circuit board. In these LED modules, since the electrode pads directly adjoin the solder pastes, metal elements such as tin (Sn) diffuse from the solder pastes into the light emitting diode through the pads and cause short circuit in the light emitting diode and device failure.

GaN-based compound semiconductors are formed by epitaxial growth on a sapphire substrate, the crystal structure and lattice parameter of which are similar to those of the semiconductors, in order to reduce crystal defects. However, the epitaxial layers grown on the sapphire substrate contain many crystal defects such as V-pits, threading dislocations, and the like. When high voltage static electricity is applied to the epitaxial layers, current is concentrated at crystal defects in the epitaxial layers, causing diode breakdown. Thus, with respect to electrostatic discharge or electrical fast transient (EFT), which is a spark generated in a switch, and lightning surge in air, securing reliability of LEDs becomes important.

Generally, in packaging of a light emitting diode, a Zener diode is mounted together with the light emitting diode to prevent electrostatic discharge. However, the Zener diode is expensive and a process of mounting the Zener diode increases the number of processes for packaging the light emitting diode and manufacturing costs. Moreover, since the Zener diode is placed near the light emitting diode in the LED package, the LED package has deteriorated luminous efficacy due to absorption of light by the Zener diode and deteriorated LED package yield.

Hereinafter, exemplary embodiments of the disclosed technology will be described in detail with reference to the accompanying drawings. It should be understood that the following embodiments are provided as some examples of the disclosed technology to facilitate understanding of the disclosed technology. Thus, it should be understood that the disclosed technology is not limited to the following embodiments and may be embodied in different ways. In addition, in the drawings, the width, length and thickness of components may be exaggerated for convenience. Further, it should be noted that the drawings are not to precise scale. Like components will be denoted by like reference numerals throughout the specification.

FIG. 1 is a schematic sectional view of an LED module in accordance with one embodiment of the disclosed technology.

Referring to FIG. 1, an LED module according to an exemplary embodiment of the disclosed technology includes a printed circuit board 51 having pads 53a and 53b and a light emitting diode 100 bonded to the printed circuit board 51 via solder pastes 55.

The printed circuit board has a printed circuit thereon, and any substrate capable of providing an LED module can be used as the printed circuit board without limitation.

Conventionally, a light emitting diode is mounted on a substrate having a lead frame or lead electrodes formed thereon, and a light emitting diode package including such a light emitting diode is mounted on a printed circuit board. According to some implementations, the light emitting diode 100 is directly mounted on the printed circuit board 51 via the solder pastes 55.

The light emitting diode 100 may include a flip-chip type light emitting diode and be mounted upside down on the printed circuit board. To this end, the light emitting diode 100 has a first electrode pad region 43a and a second electrode pad region 43b. The first and second electrode pad regions 43a and 43b may be formed in a recess shape on one surface of the light emitting diode 100.

On the other hand, a lower surface of the light emitting diode 100, for example, a surface of the light emitting diode opposite the first and second electrode pad regions 43a and 43b, may be covered with a wavelength conversion layer 45. The wavelength conversion layer 45 may cover not only the lower surface of the light emitting diode 100 but also side surfaces of the light emitting diode 100.

In FIG. 1, the light emitting diode is schematically shown for convenience of description. The structure and respective components of the light emitting diode will be more clearly understood in the following description of a method of fabricating the light emitting diode. Furthermore, it should be noted that light emitting diodes according to embodiments of the disclosed technology are not limited to the structure in which the light emitting diode is directly mounted on the printed circuit board.

FIG. 2(a) to FIG. 10 are views illustrating a method of fabricating a light emitting diode in accordance with an exemplary embodiment of the disclosed technology. In each feature, (a) is a plan view, (b) is a cross-sectional view taken along line A-A, and (c) is a cross-sectional view taken along line B-B.

Figure 2A:
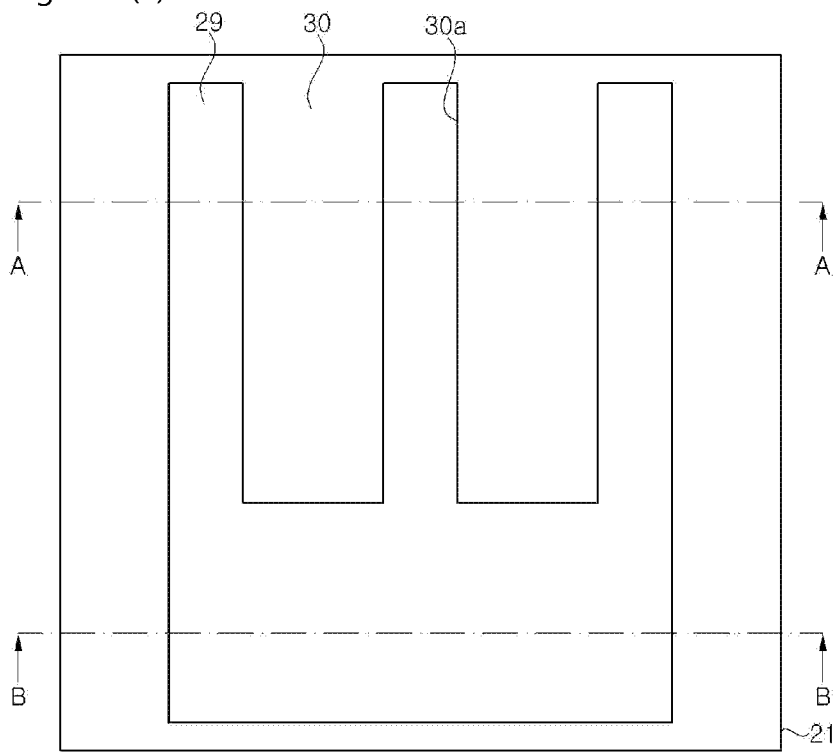
FIG. 2(a) to FIG. 10 are views illustrating an exemplary method of fabricating a light emitting diode in accordance with an embodiment of the disclosed technology, and in each of FIG. 2 to FIG. 9, (a) is a plan view, (b) is a cross-sectional view taken along line A-A, and (c) is a cross-sectional view taken along line B-B.
Figure 2B:
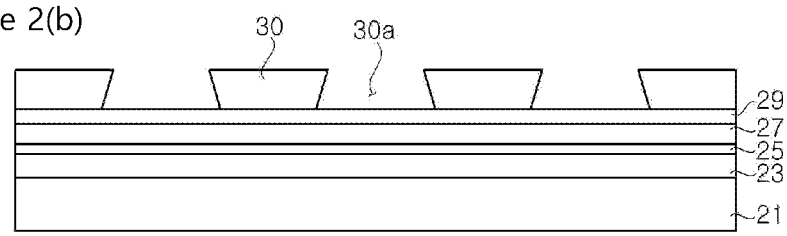
Figure 2C:
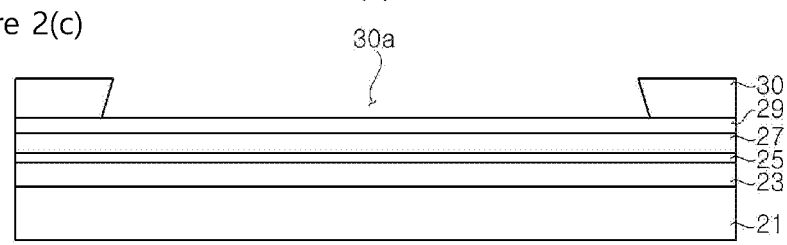

First, referring to FIGS. 2(a) to 2(c), a first conductive-type semiconductor layer 23, an active layer 25 and a second conductive-type semiconductor layer 27 are grown on a substrate 21. The substrate 100 enables the growth of a GaN-based semiconductor layer, and may include, for example, a sapphire substrate, a silicon carbide substrate, a GaN substrate, or a spinel substrate, and the like. In some implementations, the substrate may be or include a patterned substrate such as a patterned sapphire substrate.

For example, the first conductive-type semiconductor layer may include an n-type gallium nitride-based layer and the second conductive-type semiconductor layer 27 may include a p-type gallium nitride-based layer. In addition, the active layer 25 may have a single quantum well structure or a multi-quantum well structure, and may include well layers and barrier layers. In addition, the composition of the well layers may be determined according to the wavelength of light and may include, for example, AlGaN, GaN or InGaN.

On the other hand, a pre-oxidation layer 29 may be formed on the second conductive-type semiconductor layer 27. The pre-oxidation layer 29 may be formed of or include, for example, $SiO_2$ by chemical vapor deposition.

Then, a photoresist pattern 30 is formed. The photoresist pattern 30 is patterned to have openings 30a. As shown in FIG. 2(a) and FIG. 2(b), the openings 30a are formed such that an inlet of each opening has a narrower width than a bottom of the opening. The photoresist pattern 30 having the openings 30a of this structure can be easily formed using a negative type photoresist.

Figure 3A:
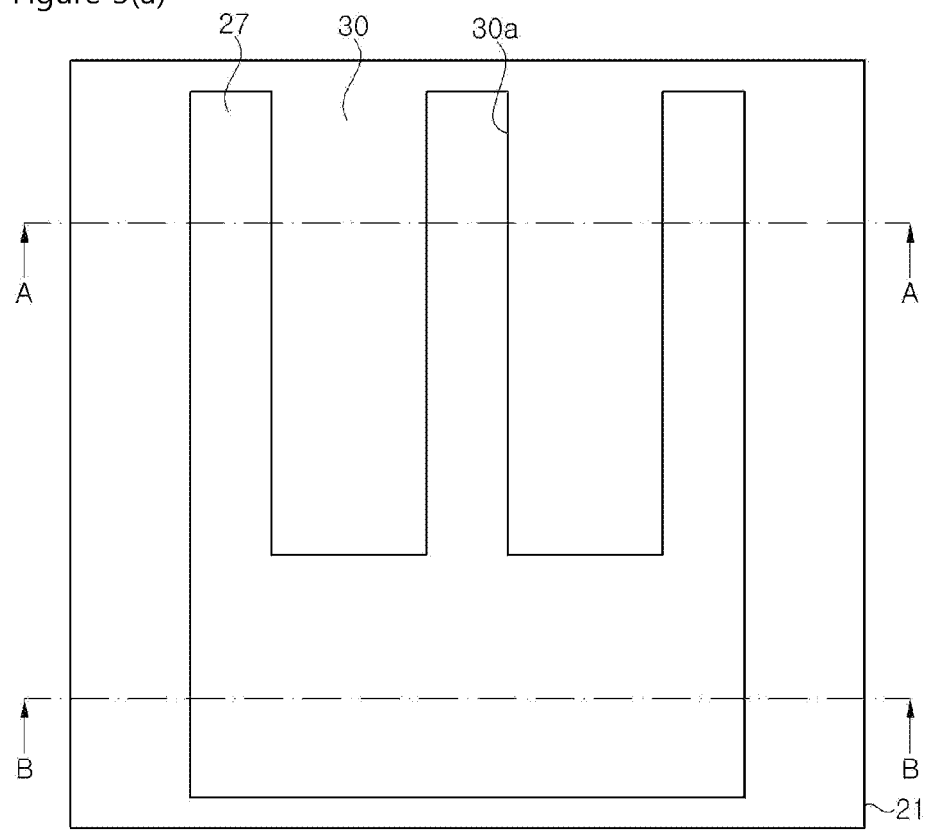
Figure 3B:
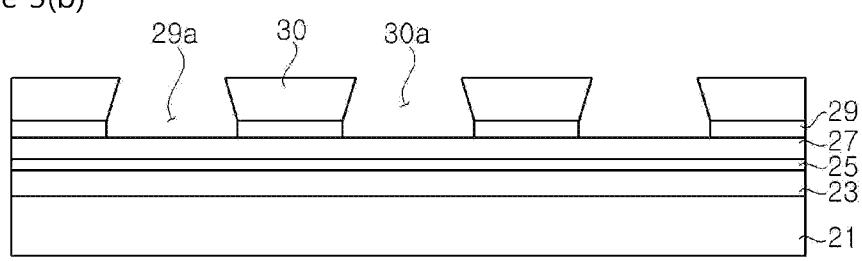
Figure 3C:
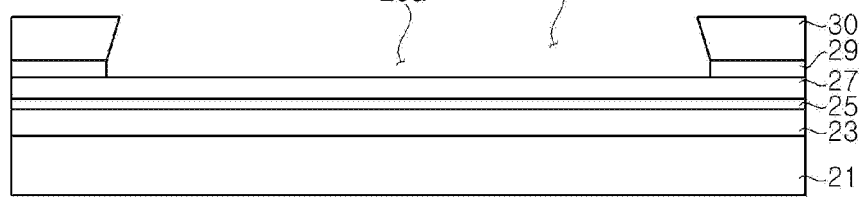

Referring to FIGS. 3(a) to 3(c), the pre-oxidation layer 29 is etched using the photoresist pattern 30 as an etching mask. The pre-oxidation layer 29 may be etched by wet etching. As a result, the pre-oxidation layer 29 in the openings 30a of the photoresist pattern 30 is etched to form openings 29a of the pre-oxidation layer 29, which expose the second conductive-type semiconductor layer 27. The bottom portions of the openings 29a are generally similar or greater than the bottom portions of the openings 30a of the photoresist pattern 30.

Figure 4A:
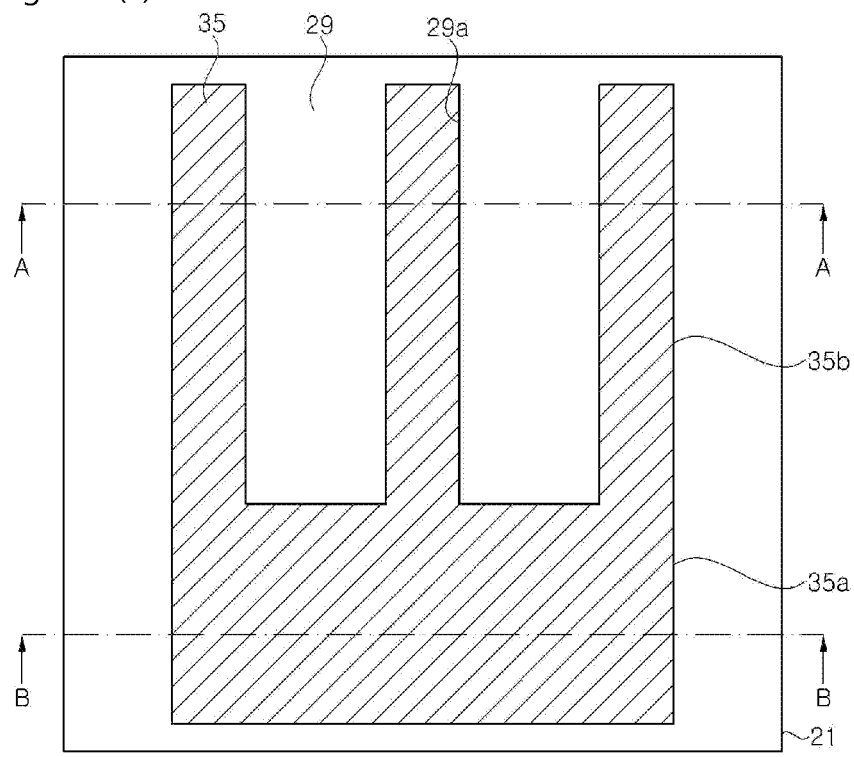
Figure 4B:
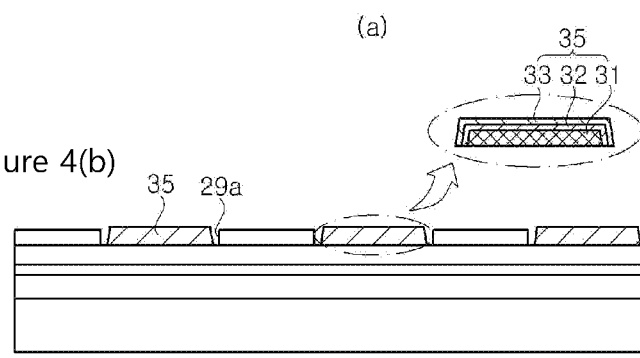
Figure 4C:
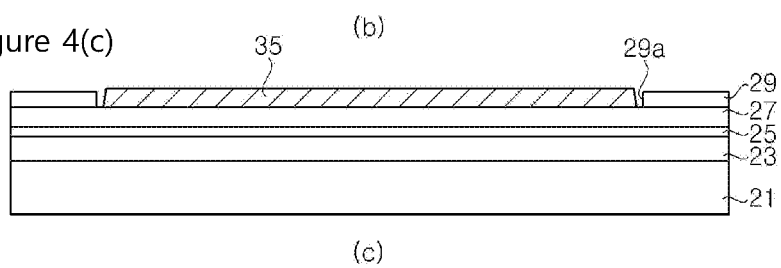

Referring to FIG. 4, a reflective electrode structure 35 is formed by a lift-off technology. The reflective electrode structure 35 may include a reflective metal section 31, a capping metal section 32 and an anti-oxidation metal section 33. The reflective metal section 31 includes a reflective layer, and a stress relief layer may be further formed between the reflective metal section 31 and the capping metal section 32. The stress relief layer relieves stress due to difference in coefficient of thermal expansion between the reflective metal section 31 and the capping metal section 32.

The reflective metal section 31 may be formed of or include, for example, Ni/Ag/Ni/Au, and may have an overall thickness of about 1600 Å. As shown, the reflective metal section 31 is formed to have a slanted side surface, for example, such that the bottom of the reflective metal section has a relatively wide area. Such a reflective metal section 31 may be formed by e-beam evaporation.

The capping metal section 32 covers upper and side surfaces of the reflective metal section 31 to protect the reflective metal section 31. The capping metal section 32 may be formed by sputtering or by e-beam evaporation, for example, planetary e-beam evaporation, in which vacuum deposition is performed while rotating the substrate 21 in a slanted state. The capping metal section 32 may include Ni, Pt, Ti, or Cr, and may be formed by depositing, for example, about five pairs of Ni/Pt layers or about five pairs of Ni/Ti layers. Alternatively, the capping metal section 32 may include TiW, W, or Mo.

A material for the stress relief layer may be selected in various ways depending upon metal components of the reflective layer and the capping metal section 32. For example, when the reflective layer is composed of or includes Al or Al-alloys and the capping metal section 32 is composed of or includes W, TiW or Mo, the stress relief layer may be or include a single layer of Ag, Cu, Ni, Pt, Ti, Rh, Pd or Cr, or a composite layer of Cu, Ni, Pt, Ti, Rh, Pd or Au. In addition, when the reflective layer is composed of or includes Al or Al-alloys and the capping metal section 32 is composed of or includes Cr, Pt, Rh, Pd or Ni, the stress relief layer may be or include a single layer of Ag or Cu, or a composite layer of Ni, Au, Cu or Ag.

In addition, when the reflective layer is composed of or includes Ag or Ag-alloys and the capping metal section 32 is composed of or includes W, TiW or Mo, the stress relief layer may be or include a single layer of Cu, Ni, Pt, Ti, Rh, Pd or Cr, or a composite layer of Cu, Ni, Pt, Ti, Rh, Pd, Cr or Au. Further, when the reflective layer is composed of or includes Ag or Ag-alloys and the capping metal section 32 is composed of or includes Cr or Ni, the stress relief layer may be or include a single layer of Cu, Cr, Rh, Pd, TiW or Ti, or a composite layer of Ni, Au or Cu.

Further, the anti-oxidation metal section 33 includes Au in order to prevent oxidation of the capping metal section 32, and may be formed of or include, for example, Au/Ni or Au/Ti. Since Ti secures adhesion of an oxide layer such as $SiO_2$, in some implementations, Ti can be used. The anti-oxidation metal section 33 may also be formed by sputtering or by e-beam evaporation, for example, planetary e-beam evaporation, in which vacuum deposition is performed while rotating the substrate 21 in a slanted state.

The photoresist pattern 30 is removed after deposition of the reflective electrode structure 35, whereby the reflective electrode structure 35 remains on the second conductive-type semiconductor layer 27, as shown in FIG. 4.

The reflective electrode structure 35 may include branches 35b and a connecting portion 35a, as shown in FIG. 4. The branches 35b may have an elongated shape and be parallel to each other. The connecting portion 35a connects the branches 35b to each other. However, it should be understood that the reflective electrode structure 35 is not limited to a particular shape and may be modified into various shapes.

Figure 5A:
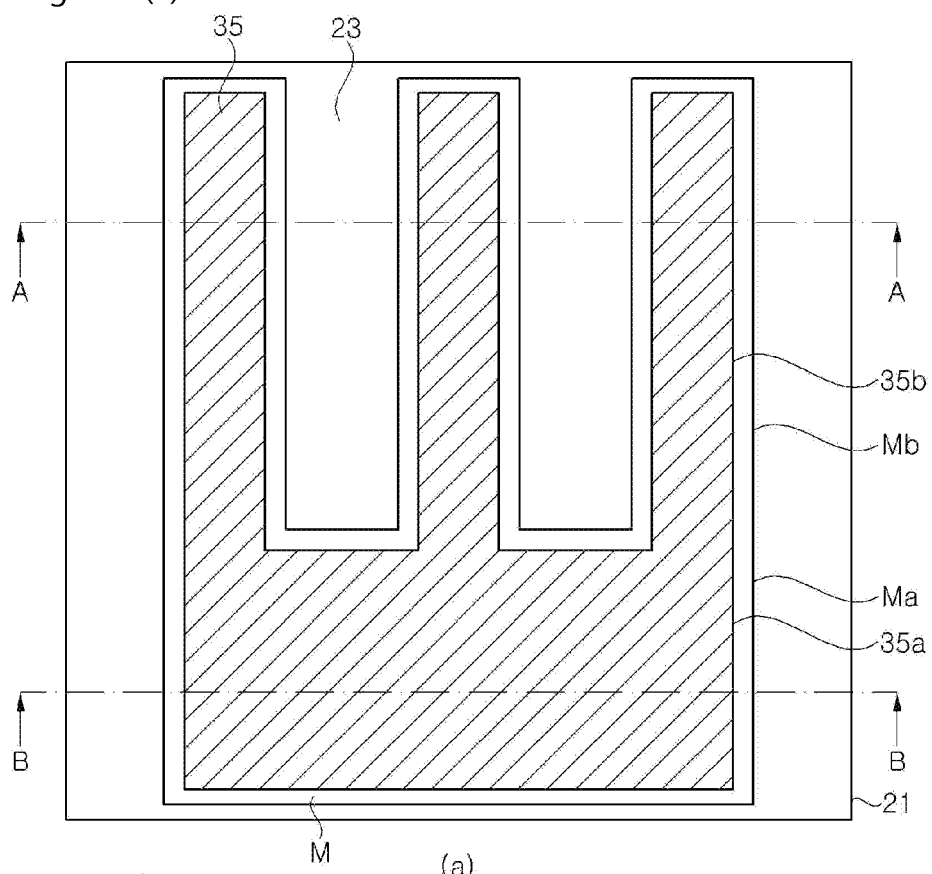
Figure 5B:
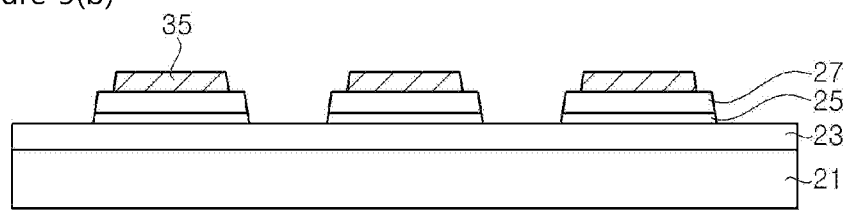
Figure 5C:
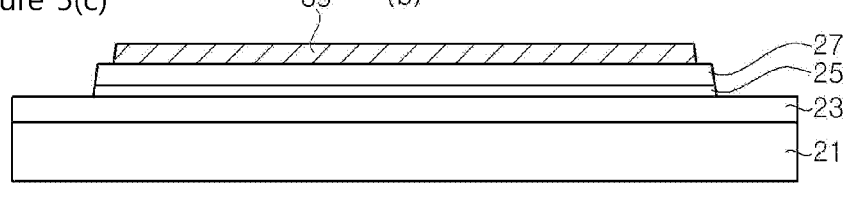

Referring to FIG. 5, a mesa M is formed on the first conductive-type semiconductor layer 21. The mesa M includes the active layer 25 and the second conductive-type semiconductor layer 27. The active layer 25 is placed between the first conductive-type semiconductor layer 23 and the second conductive-type semiconductor layer 27. The reflective electrode structure 35 is placed on the mesa M.

The mesa M is formed by patterning the second conductive-type semiconductor layer 27 and the active layer 25 so as to expose the first conductive-type semiconductor layer 23. The mesa M may be formed to have a slanted side surface by photoresist reflow technology or the like. The slanted profile of the side surface of the mesa M enhances extraction efficiency of light generated in the active layer 25.

As shown, the mesa M may include elongated branches Mb extending parallel to each other in one direction and a connection portion Ma connecting the branches to each other. With such configuration of the mesa, the light emitting diode can permit uniform spreading of electric current in the first conductive-type semiconductor layer 23. Here, it should be understood that the mesa M is not limited to a particular shape and may be modified into various shapes. On the other hand, the reflective electrode structure 35 covers most of the upper surface of the mesa M and generally has the same shape as the shape of the mesa M in plan view.

While the second conductive-type semiconductor layer 27 and the active layer 25 are subjected to etching, the pre-oxidation layer 29 remaining on these layers is also partially removed by etching. On the other hand, although the pre-oxidation layer 29 can remain near an edge of the reflective electrode structure 35 on each of the mesa M, the remaining pre-oxidation layer 29 can also be removed by wet etching and the like. Alternatively, the pre-oxidation layer 29 may be removed before formation of the mesa M.

Figure 6A:
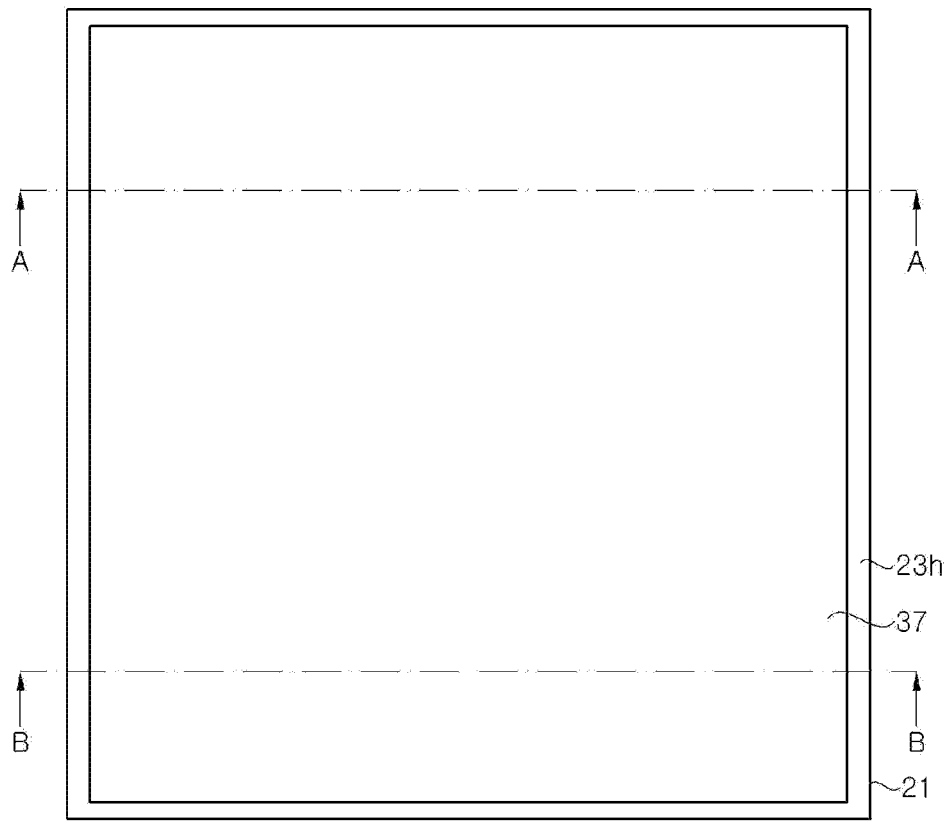
Figure 6B:
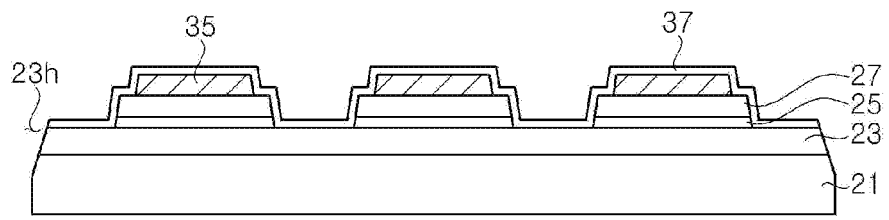
Figure 6C:
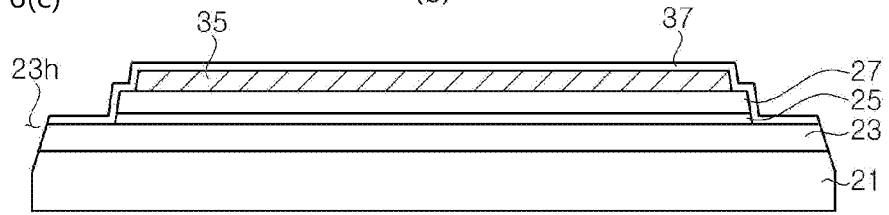

Referring to FIG. 6, after the mesa M is formed, a lower insulation layer 37 is formed to cover the mesa M and the first conductive-type semiconductor layer. The lower insulation layer 37 may be formed of or include an oxide layer such as $SiO_2$ and the like, a nitride layer such as SiNx and the like, or an insulation layer of $MgF_2$ by chemical vapor deposition (CVD) and the like. The lower insulation layer 37 may be a single layer or multiple layers. In addition, the lower insulation layer 37 may be or include a distributed Bragg reflector (DBR) in which low refractive index material layers and high refractive index material layers are alternately stacked one above another. For example, an insulating reflective layer having high reflectivity may be formed by stacking dielectric layers such as $SiO_2/TiO_2$, or $SiO_2/Nb_2O_5$, and the like.

Then, a chip isolation region 23h is formed by laser scribing to divide the lower insulation layer 37 and the first conductive-type semiconductor layer 23 into chip units. Grooves may be formed on the upper surface of the substrate 21 by laser scribing. As a result, the substrate 21 is exposed near an edge of the first conductive-type semiconductor layer 23.

Since the first conductive-type semiconductor layer 23 is divided into chip units by laser scribing, it is possible to omit a separate photomask for an isolation process. However, it should be understood that the disclosed technology is not limited to the isolation process using laser scribing. For example, the first conductive-type semiconductor layer 23 may be divided into chip units before or after formation of the lower insulation layer 37 using a typical photolithography and etching technique.

As shown in FIG. 6, the mesa M may be formed to be placed only inside an upper region of the first conductive-type semiconductor layer 23. For example, the mesa M may be placed in an island shape on the upper region of the first conductive-type semiconductor layer 23.

Figure 7A:
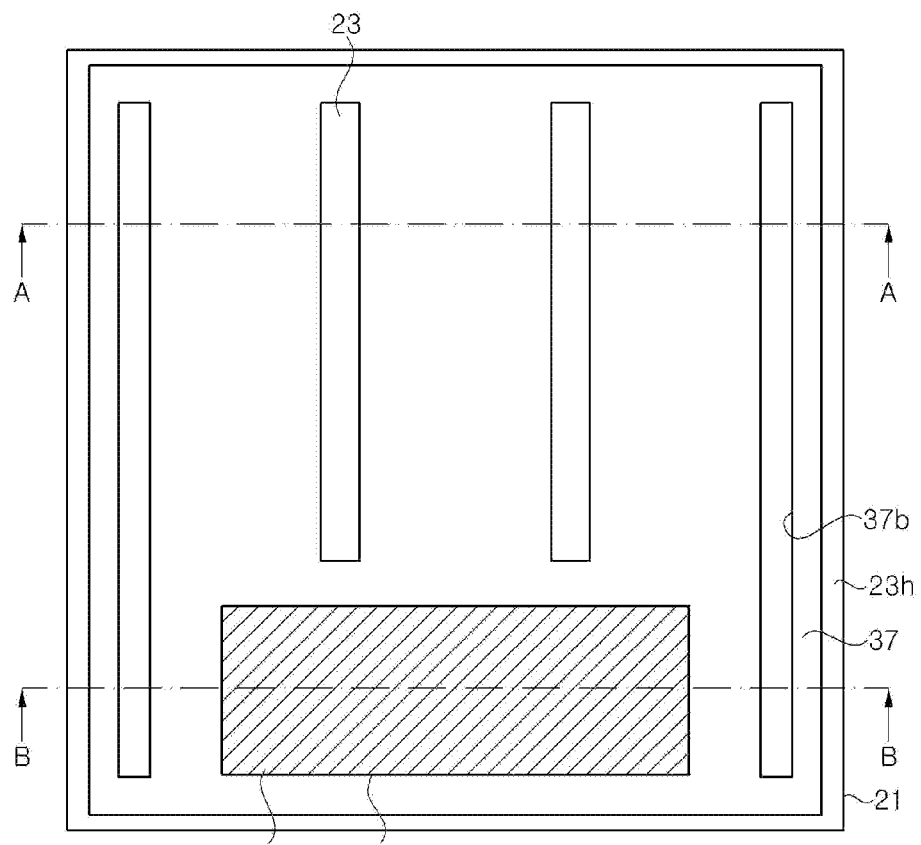
Figure 7B:
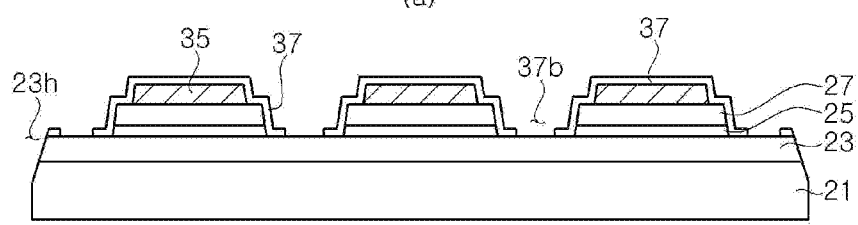
Figure 7C:
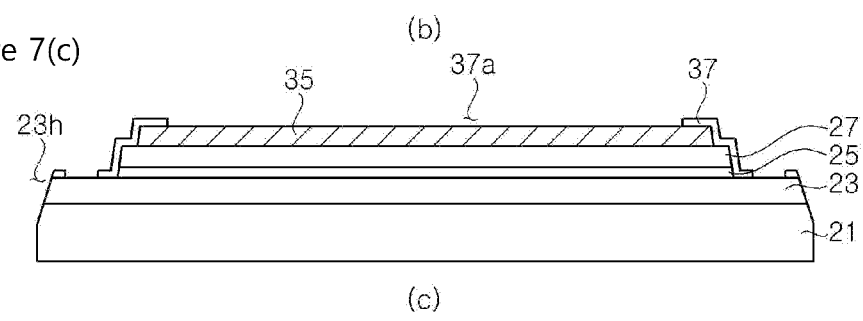

Next, referring to FIG. 7, the lower insulation layer 37 is subjected to patterning to form openings 37a and 37b in predetermined regions to allow electrical connection to the first conductive-type semiconductor layer 23 and the second conductive-type semiconductor layer 27. For example, the lower insulation layer 37 may have openings 37b which expose the first conductive-type semiconductor layer 23, and openings 37a which expose the reflective electrode structure 35.

The openings 37a are placed only in upper regions of the mesas M, for example, on the connecting portions of the mesas M. The openings 37b may be placed in regions between the branches Mb of the mesas M and near the edge of the substrate 21, and may have an elongated shape extending along the branches Mb of the mesas M.

Figure 8A:
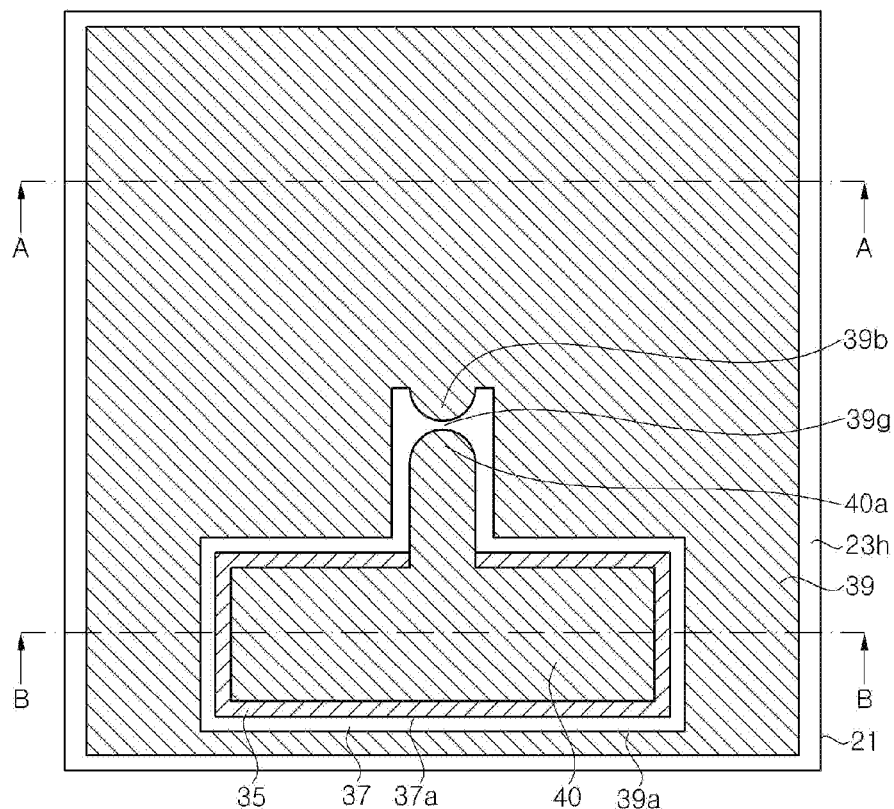
Figure 8B:
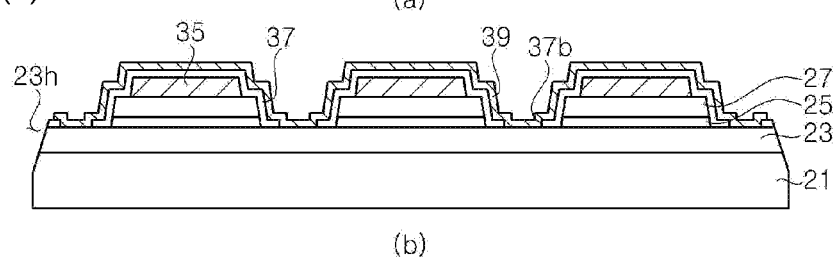
Figure 8C:
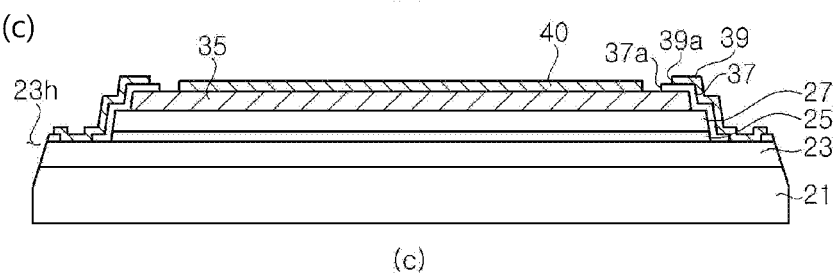

Referring to FIG. 8, a current spreading layer 39 is formed on the lower insulation layer 37. The current spreading layer 39 covers the mesa M and the first conductive-type semiconductor layer 23. In addition, the current spreading layer 39 has an opening 39a placed in the upper region of the mesa M and exposing the reflective electrode structure 35. The current spreading layer 39 may form ohmic contact with the first conductive-type semiconductor layer 23 through the opening 37b of the lower insulation layer 37. The current spreading layer 39 is insulated from the mesa M and the reflective electrodes 35 by the lower insulation layer 37.

The opening 39a of the current spreading layer 39 has a greater area than the opening 37a of the lower insulation layer 37 to prevent the current spreading layer 39 from being connected to the reflective electrode structures 35. Thus, the opening 39a has sidewalls placed on the lower insulation layer 37.

The current spreading layer 39 is formed on an overall upper region of the substrate 21 excluding the openings 39a. Thus, electric current can be easily dispersed through the current spreading layer 39.

The current spreading layer 39 may include an ohmic contact layer, a reflective metal layer, an anti-diffusion layer, and an anti-oxidation layer. The current spreading layer can form ohmic contact with the first conductive-type semiconductor layer through the ohmic contact layer. For example, the ohmic contact layer may be formed of or include Ti, Cr, or Ni, and the like. The reflective metal layer increases reflectivity of the light emitting diode by reflecting incident light entering the current spreading layer. The reflective metal layer may be formed of or include Al. In addition, the anti-diffusion layer protects the reflective metal layer by preventing diffusion of metal elements. For example, the anti-diffusion layer can prevent diffusion of metal elements such as Sn within a solder paste. The anti-diffusion layer may be composed of or include Cr, Ti, Ni, Mo, TiW, or W or combinations thereof. The anti-diffusion layer may be a single layer including Mo, TiW or W. Alternatively, the anti-diffusion layer may include a pair of Cr, Ti or Ni layers. For example, the anti-diffusion layer may include at least two pairs of Ti/Ni or Ti/Cr layers. The anti-oxidation layer is formed to prevent oxidation of the anti-diffusion layer and may include Au.

The current spreading layer may have a reflectivity of 65% to 75%. Accordingly, the light emitting diode according to this embodiment can provide optical reflection by the current spreading layer in addition to optical reflection by the reflective electrode structure, whereby light traveling through the sidewall of the mesa and the first conductive-type semiconductor layer can be reflected.

The current spreading layer may further include a bonding layer placed on the anti-oxidation layer. The bonding layer may include Ti, Cr, Ni or Ta. The bonding layer is used to enhance bonding strength between the current spreading layer and the upper insulation layer, and may be omitted.

For example, the current spreading layer 39 may have a multi-layer structure including Cr/Al/Ni/Ti/Ni/Ti/Au/Ti.

While the current spreading layer 39 is formed, an anti-diffusion reinforcing layer 40 is formed on the reflective electrode structure 35. The anti-diffusion reinforcing layer 40 and the current spreading layer 39 may be formed of or include the same material by the same process. The anti-diffusion reinforcing layer 40 is separated from the current spreading layer 39. The anti-diffusion reinforcing layer 40 is placed within the opening 39a of the current spreading layer 39.

The anti-diffusion reinforcing layer 40 has a leading end 40a extending therefrom, and the current spreading layer 39 has a leading end 39b facing the leading end 40a. The leading end 40a may be placed on the lower insulation layer 37 outside the opening 37a of the lower insulation layer 37. However, it should be understood that the disclosed technology is not limited thereto. Alternatively, the opening 37a of the lower insulation layer 37 may have a similar shape to the shape of the leading end 40a, and the leading end 40a may be placed within the opening 40a of the lower insulation layer 37.

The leading end 39a of the current spreading layer 39 is placed on the lower insulation layer 37 and is separated from the leading end 40a. The leading end 39b and the leading end 40a define a spark gap therebetween. As a result, these leading ends 39b and 40a may be placed closer than other portions or may have an angled shape in order to allow generation of an electric spark between the leading ends 39b and 40a when high voltage static electricity is applied to a gap between the current spreading layer 39 and the anti-diffusion reinforcing layer 40. For example, as shown in FIG. 8, the leading ends 39b and 40a may have a semicircular shape or an angled shape and may be disposed to face each other.

Figure 9A:
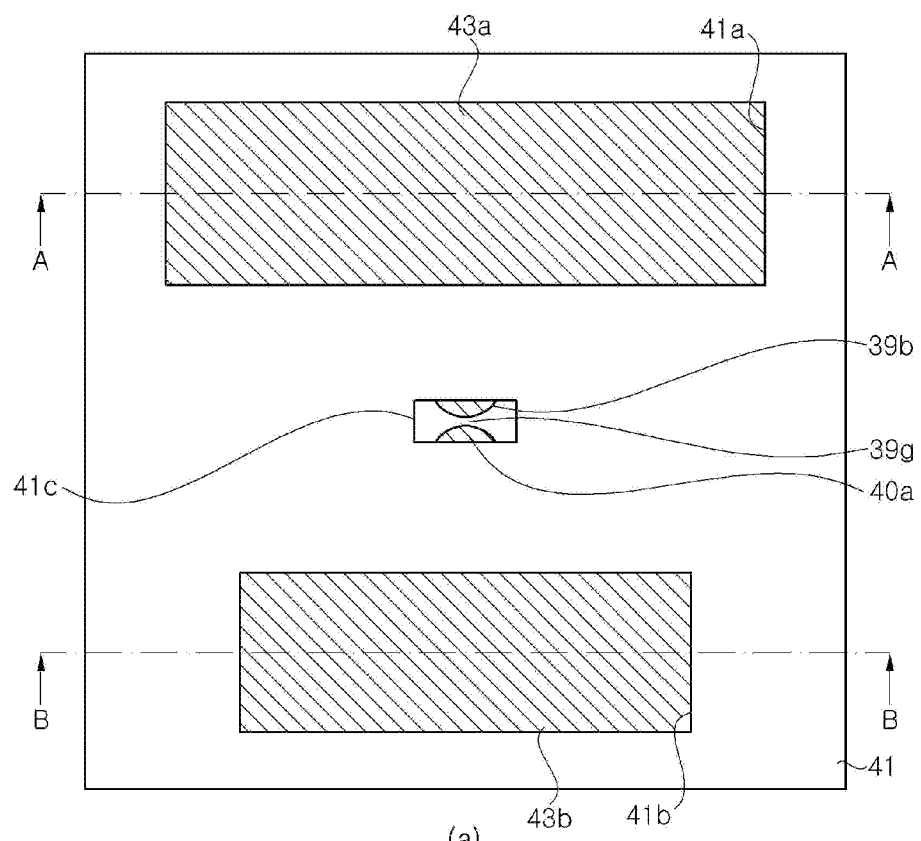
Figure 9B:
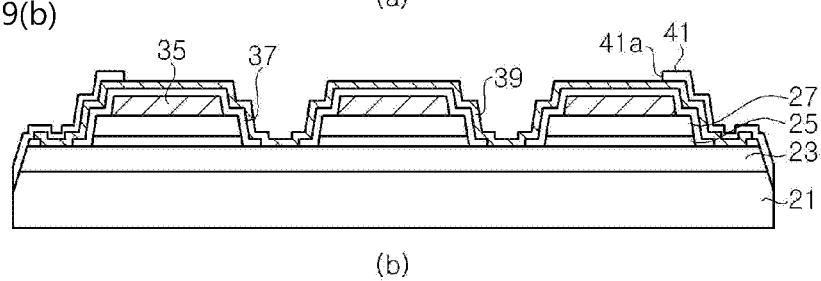
Figure 9C:
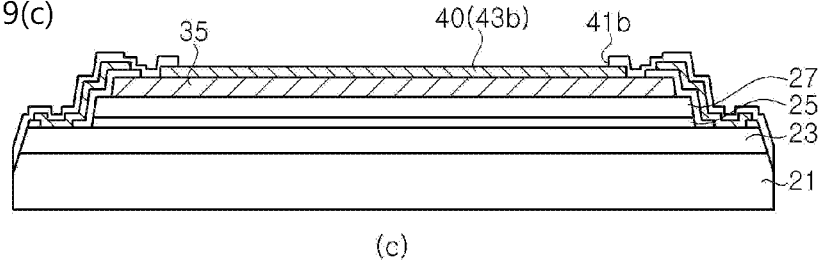

Referring to FIG. 9, an upper insulation layer 41 is formed on the current spreading layer 39. The upper insulation layer 41 has an opening 41a which exposes the current spreading layer 39 to define a first electrode pad region 43a, and an opening 41b which exposes the reflective electrode structure 35 to define a second electrode pad region 43a. The opening 41a may have an elongated shape perpendicular to the branches Mb of the mesa M. The opening 41b of the upper insulation layer 41 has a narrower area than the opening 39a of the current spreading layer 39 and thus the upper insulation layer 41 can cover the sidewall of the opening 39a.

When the anti-diffusion reinforcing layer 40 is formed on the reflective electrode structure 35, the opening 41b exposes the anti-diffusion reinforcing layer 40. In this case, the reflective electrode structure 35 can be concealed or sealed by the upper insulation layer 41 and the anti-diffusion reinforcing layer 40. Furthermore, the upper insulation layer 41 has an opening 41c which exposes at least part of the leading end 39b and the leading end 40a. With this configuration, the spark gap between the leading end 39b and the leading end 40a is exposed, thereby allowing generation of electrostatic discharge by an electrical spark through air.

Further, the upper insulation layer 41 may be formed on the chip isolation region 23h to cover the side surface of the first conductive-type semiconductor layer 23. With this configuration, it is possible to prevent penetration of moisture and the like through upper and lower interfaces of the first conductive-type semiconductor layer.

The upper insulation layer 41 may be formed of or include a silicon nitride layer to prevent diffusion of metal elements from solder pastes, and may have a thickness of 1 m to 2 m. When the thickness of the upper insulation layer is less than 1 m, it is difficult to prevent diffusion of metal the elements from the solder pastes.

Optionally, an anti-Sn diffusion plating layer (not shown) may be additionally formed on the first electrode pad region 43a and the second electrode pad region 43b by electroless plating such as ENIG (electroless nickel immersion gold) and the like.

The first electrode pad region 43a is electrically connected to the first conductive-type semiconductor layer 23 through the current spreading layer 39, and the second electrode pad region 43b is electrically connected to the second conductive-type semiconductor layer 27 through the anti-diffusion reinforcing layer 40 and the reflective electrode structure 35.

The first electrode pad region 43a and the second electrode pad region 43b are used to mount the light emitting diode on a printed circuit board and the like via solder pastes. Thus, in order to prevent short circuit between the first electrode pad region 43a and the second electrode pad region 43b by the solder pastes, electrode pads may be separated by a distance of about 300 m or more from each other.

Then, the substrate 21 may be removed to have a small thickness by partially grinding and/or lapping a lower surface of the substrate 21. Then, the substrate 21 is divided into individual chip units, thereby providing divided light emitting diode chips. Here, the substrate 21 may be divided at the chip isolation region 23h formed by laser scribing and thus there is no need for additional laser scribing for division of chips.

The substrate 21 may be removed from the light emitting diode chips before or after being divided into individual light emitting diode chip units.

Figure 10:
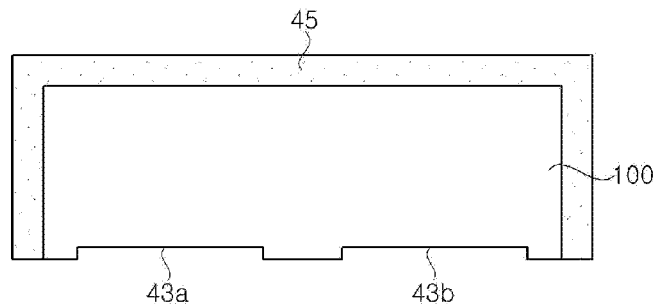

Referring to FIG. 10, a wavelength conversion layer 45 is formed on the light emitting diodes separated from each other. The wavelength conversion layer 45 may be formed by coating a phosphor-containing resin onto the light emitting diodes using a printing technique, or by coating the substrate 21 with phosphor powder using an aerosol apparatus. For example, aerosol deposition can form a thin phosphor layer with a uniform thickness on the light emitting diodes, thereby improving color uniformity of light emitted from the light emitting diodes. As a result, the light emitting diodes according to the embodiments of the disclosed technology are completed and may be bonded to the corresponding pads 53a, 53b of the printed circuit board 51 by solder pastes, as shown in FIG. 1.

In this embodiment, the first and second electrode pad regions 43a and 43b exposed by the upper insulation layer 41 are directly mounted on the printed circuit board. However, it should be understood that the disclosed technology is not limited thereto. Alternatively, additional electrode patterns are formed on the electrode pad regions 43a and 43b to form further enlarged pad regions. In this case, however, an additional photomask for formation of the electrode patterns may be used.

FIG. 11(a) to FIG. 14(c) are views illustrating a method of fabricating a light emitting diode in accordance with another embodiment of the disclosed technology, and in each figure, (a) is a plan view, (b) is a cross-sectional view taken along line A-A, and (c) is a cross-sectional view taken along line B-B.

In the embodiments described above, the mesa M is formed after the reflective electrode structure 35 is formed. In the present implementations, the mesa M is formed before the reflective electrode structure 35 is formed.

Figure 11A:
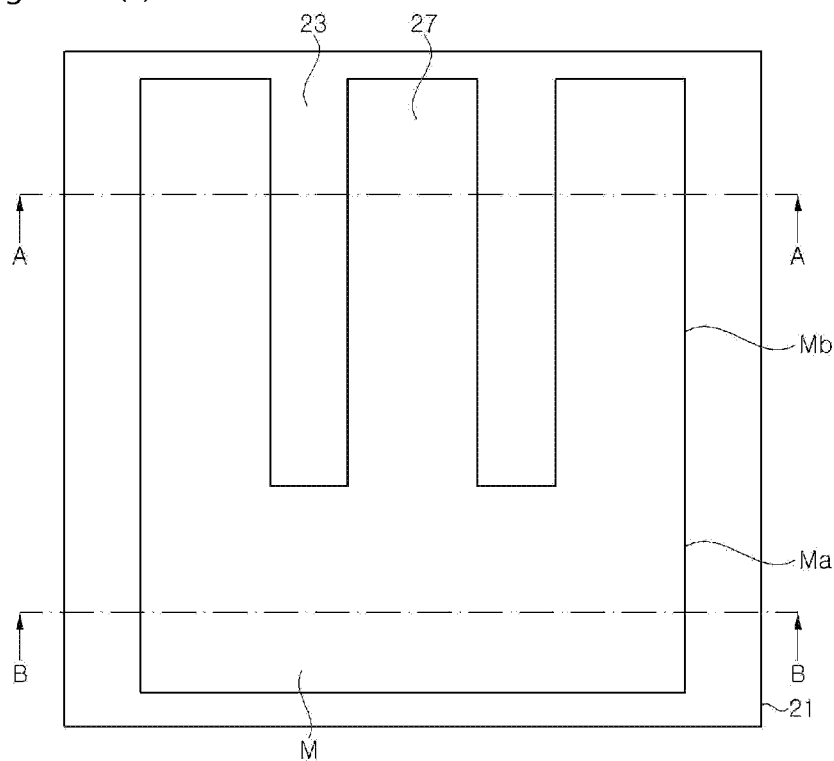
FIG. 11(a) to FIG. 14(c) are views illustrating an exemplary method of fabricating a light emitting diode in accordance with an embodiment of the disclosed technology, and in each of FIG. 11 to FIG. 14, (a) is a plan view, (b) is a cross-sectional view taken along line A-A, and (c) is a cross-sectional view taken along line B-B.
Figure 11B:
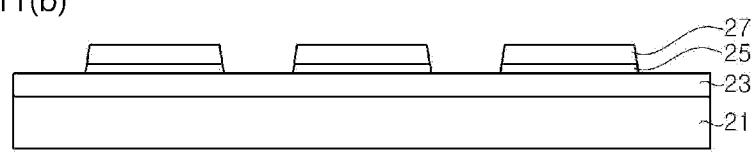
Figure 11C:
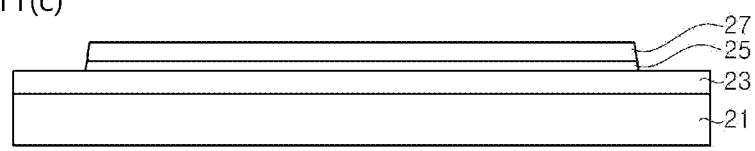

First, referring to FIG. 11, as described with reference to FIG. 2, a first conductive-type semiconductor layer 23, an active layer 25 and a second conductive-type semiconductor layer 27 are formed on a substrate 21. Then, the mesa M is formed by a patterning process. The mesa M is similar to that described above in FIG. 5, and a detailed description thereof will be omitted.

Figure 12A:
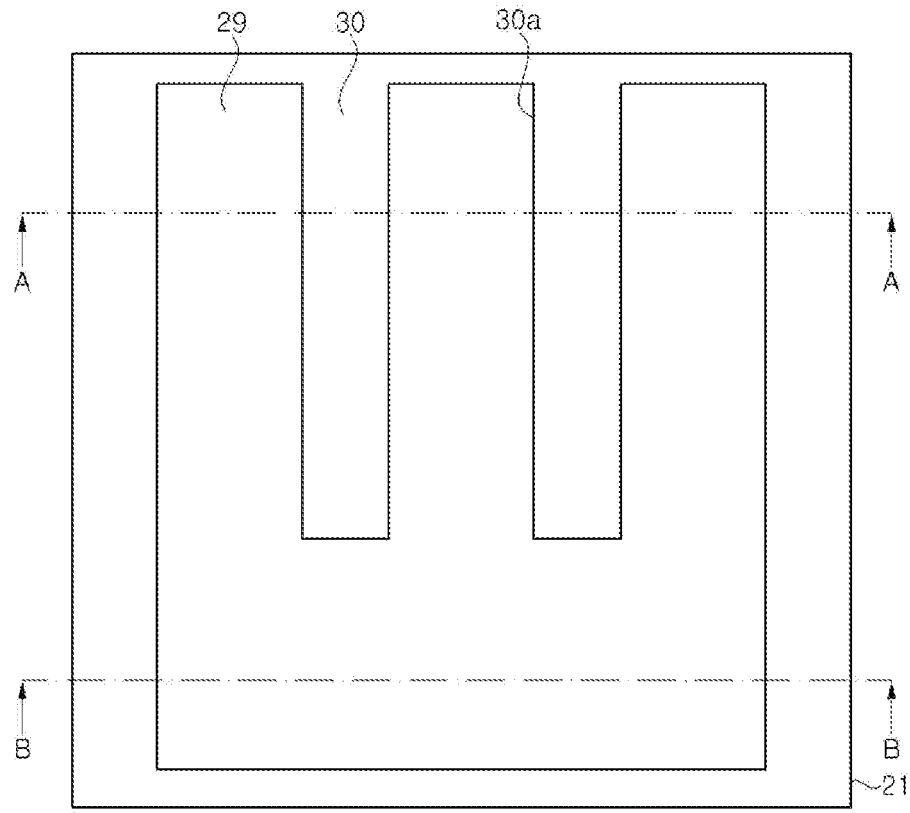
Figure 12B:
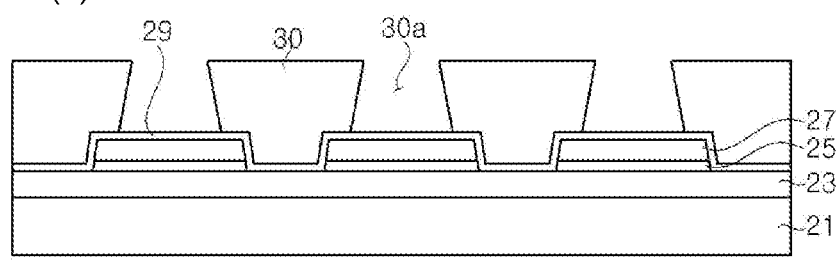
Figure 12C:
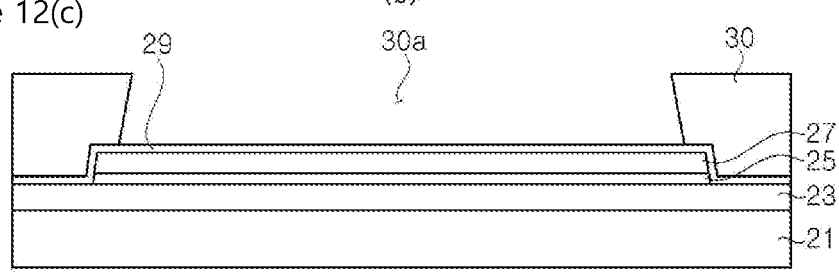

Referring to FIG. 12, a pre-oxidation layer 29 is formed to cover the first conductive-type semiconductor layer 23 and the mesa M. The pre-oxidation layer 29 may be formed of or include the same material by the same process as those described with reference to FIG. 2. A photoresist pattern 30 having openings 30a is formed on the pre-oxidation layer 29. The openings 30a of the photoresist pattern 30 are placed in an upper region of the mesa M. The photoresist pattern 30 is the same as that described with reference to FIG. 2 except that the photoresist pattern 30 is formed on the substrate 21 having the mesa M formed thereon, and a detailed description thereof will be omitted.

Figure 13A:
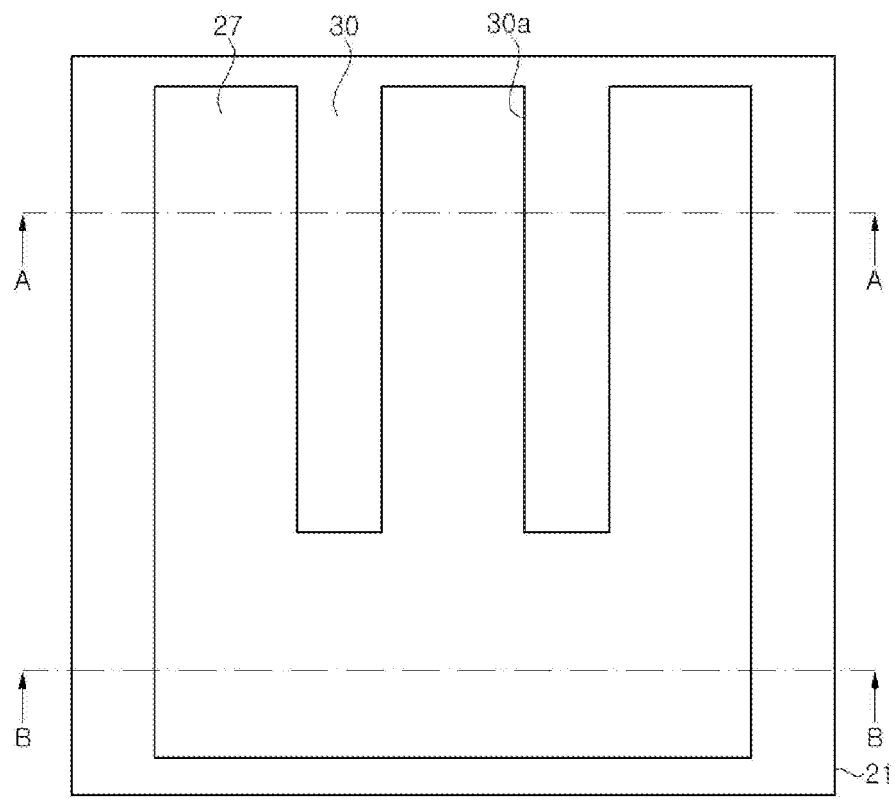
Figure 13B:
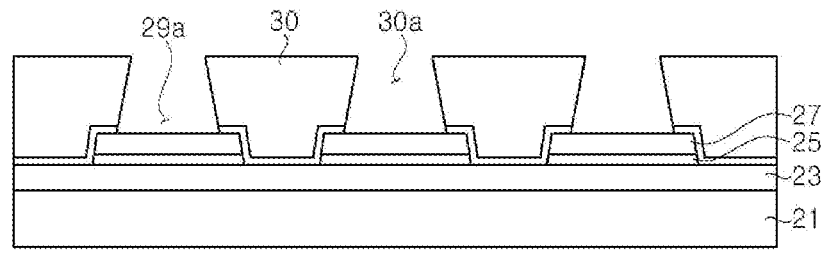
Figure 13C:
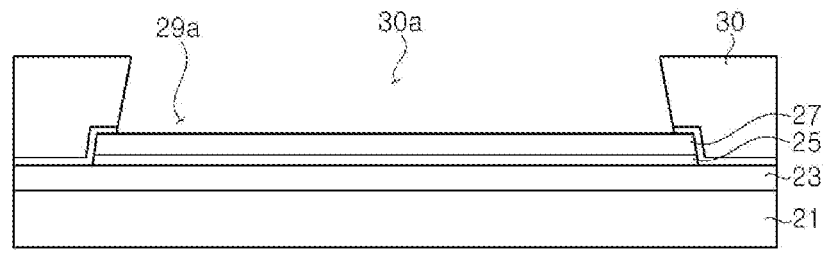

Referring to FIG. 13, the pre-oxidation layer 29 is subjected to etching through the photoresist pattern 30 used as an etching mask, so that openings 29a are formed to expose the second conductive-type semiconductor layer 27 therethrough.

Figure 14A:
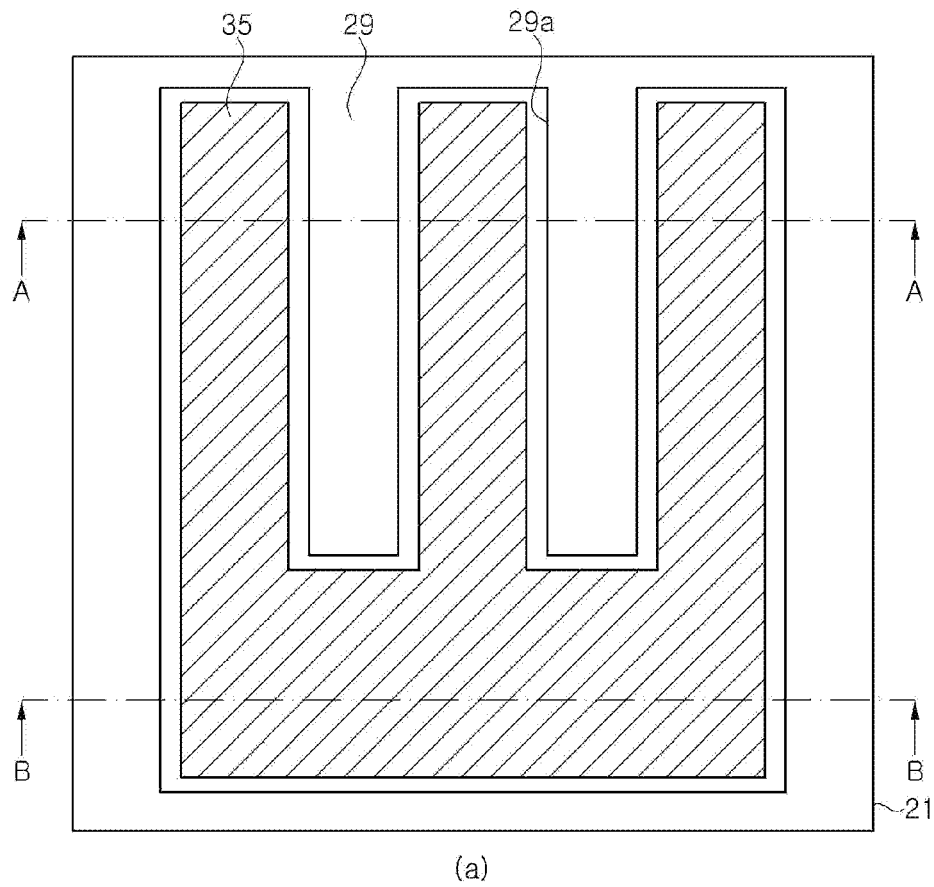
Figure 14B:
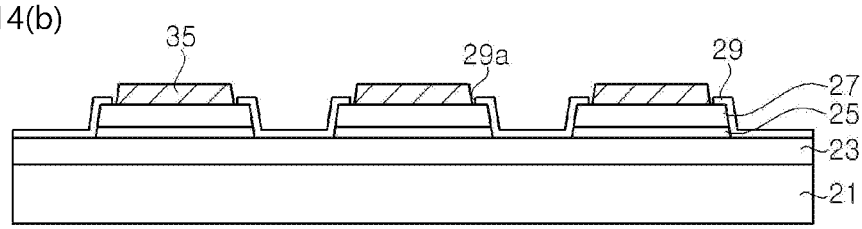
Figure 14C:
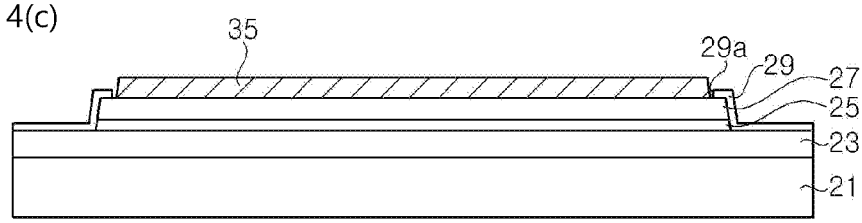

Referring to FIG. 14, as described in detail with reference to FIG. 4, the reflective electrode structure 35 is formed on each mesas M by a lift-off technique. Then, light emitting diodes can be fabricated through similar processes to the processes described above with reference to FIG. 6 to FIG. 11.

According to this embodiment, since the mesa M is formed prior to the reflective electrode structure 35, the pre-oxidation layer 29 can remain on side surfaces of the mesas M and in regions between the mesas M. Then, the pre-oxidation layer 29 is covered by the lower insulation layer 39 and is subjected to patterning together with the lower insulation layer 39.

Figure 15:
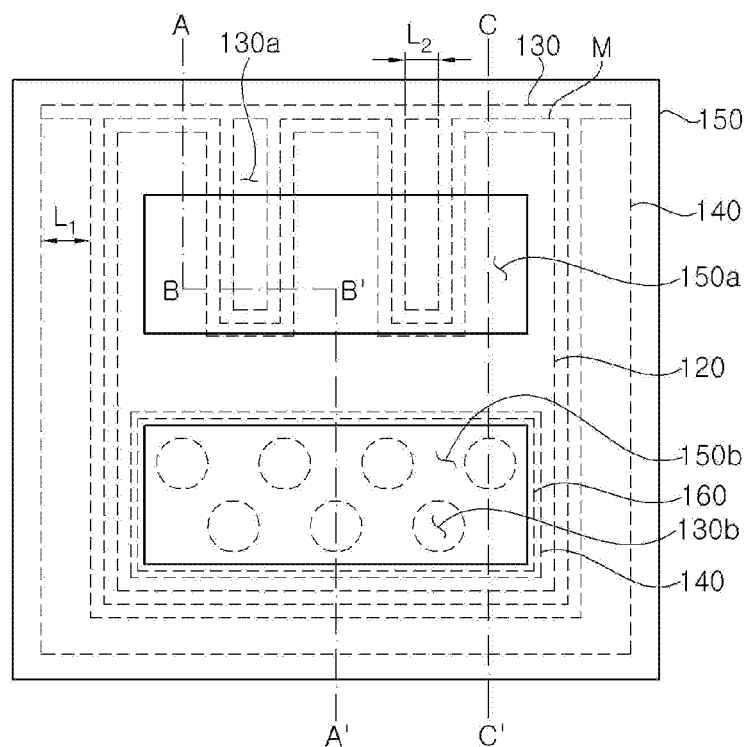
FIG. 15 is a plan view of a light emitting diode in accordance with an embodiment of the disclosed technology.
Figure 16:
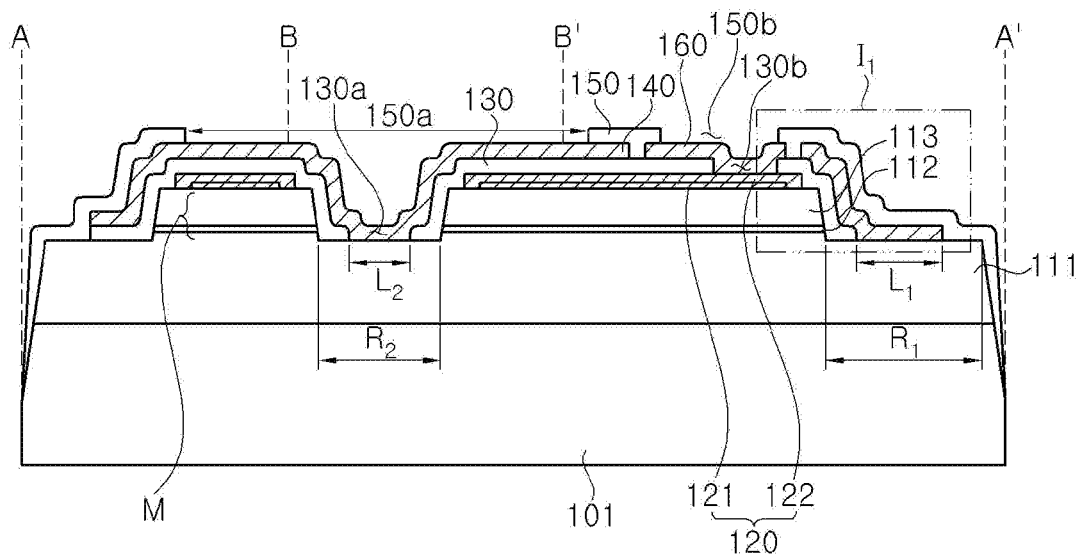
FIG. 16 is a cross-sectional view taken along line A-B-if-A' of FIG. 15.
Figure 17:
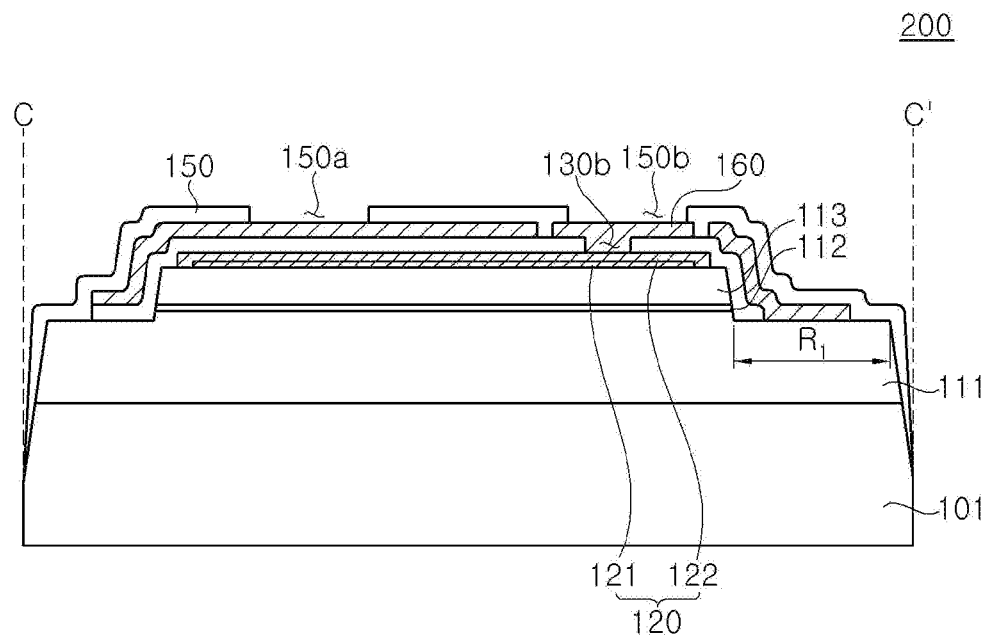
FIG. 17 is a cross-sectional view taken along line C-C' of FIG. 15.
Figure 18:
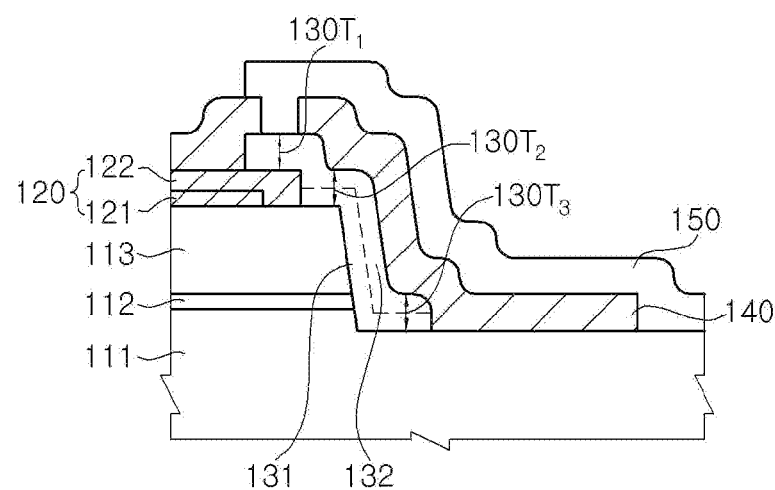
FIG. 18 is an enlarged sectional view of part $I_1$ of FIG. 16.

FIG. 15 is a plan view of a light emitting diode 200 in accordance with an embodiment of the disclosed technology, FIG. 16 is a cross-sectional view taken along line A-B-B'-A' of FIG. 15, FIG. 17 is a cross-sectional view taken along line C-C' of FIG. 15, and FIG. 18 is an enlarged view of part I of FIG. 16.

Referring to FIG. 15 to FIG. 18, the light emitting diode 200 includes a first conductive-type semiconductor layer 111, a mesa M including an active layer 112 and a second conductive-type semiconductor layer 113, a first insulation layer 130, a first electrode 140, and a second insulation layer 150, and may further include a growth substrate 101 and a second electrode 120.

The growth substrate 101 may be selected from any substrate that allows growth of the first conductive-type semiconductor layer 111, the active layer 112 and the second conductive-type semiconductor layer 113 thereon, and may include, for example, a sapphire substrate, a silicon carbide substrate, a gallium nitride substrate, an aluminum nitride substrate, or a silicon substrate, and the like. In some implementations, the growth substrate 101 may be or include a patterned sapphire substrate (PSS). The growth substrate 101 may include a slanted side surface, thereby improving extraction of light generated in the active layer 112.

The second conductive-type semiconductor layer 113 may be disposed on the first conductive-type semiconductor layer 111, and the active layer 112 may be interposed between the first conductive-type semiconductor layer 111 and the second conductive-type semiconductor layer 113. The first conductive-type semiconductor layer 111, the active layer 112, and the second conductive-type semiconductor layer 113 may include III-V based compound semiconductors, for example, a nitride-based semiconductor such as (Al, Ga, In)N. The first conductive-type semiconductor layer 111 may include n-type dopants (for example, Si) and the second conductive-type semiconductor layer 113 may include p-type dopants (for example, Mg), or vice versa. The active layer 112 may include a multi-quantum well (MQM) structure. Upon application of forward bias to the light emitting diode 200, light is emitted from the active layer 112 through recombination of electrons and holes therein. The first conductive-type semiconductor layer 111, the active layer 112, and the second conductive-type semiconductor layer 113 may be grown on the growth substrate 101, for example, by metal organic chemical vapor deposition (MOCVD), molecular bean epitaxy (MBE), or the like.

The light emitting diode 200 may include at least one mesa M that includes the active layer 112 and the second conductive-type semiconductor layer 113. Referring to FIG. 15, the mesa M may include a plurality of protrusions separated from one another. The light emitting diode 200 may include a plurality of mesas M separated from one another, without being limited thereto. The side surface of the mesa M may become a slanted side surface by a technology such as photoresist reflow, and the slanted side surface of the mesa M can improve luminous efficacy of light generated from the active layer 112.

The first conductive-type semiconductor layer 111 may include a first contact region $R_1$ and a second contact region $R_2$ exposed through the mesa M. Since the mesa M is formed by removing the active layer 112 and the second conductive-type semiconductor layer 113 disposed on the first conductive-type semiconductor layer 111, a portion excluding the mesa M becomes a contact region, which is an exposed upper surface of the first conductive-type semiconductor layer 111. The first electrode 140 described below may be electrically connected to the first conductive-type semiconductor layer 111 by contacting the first contact region $R_1$ and the second contact region $R_2$. The first contact region $R_1$ may be disposed around the mesa M along an outer periphery of the first conductive-type semiconductor layer 111, specifically, along an outer periphery of the upper surface of the first conductive-type semiconductor layer between the mesa M and the side surface of the light emitting diode 200. The second contact region $R_2$ may be at least partially surrounded by the mesa M. For example, referring to FIG. 15 and FIG. 16, the first contact region $R_1$ may be disposed near side surfaces of the first conductive-type semiconductor layer 111, and the second contact region R2 may be disposed between the protrusions of the mesa M to be partially surrounded by the mesa M. Although not shown in the drawings, when the light emitting diode includes a plurality of mesas, the second contact region $R_2$ may be disposed between the plurality of mesas. Alternatively, the second contact region $R_1$ may be entirely surrounded by the mesa M. With this structure, the light emitting diode allows electric current to flow through the outer periphery and the center of the light emitting diode 200, thereby enabling efficient current spreading.

A length of the second contact region $R_2$ in a major axis direction may be 0.5 times or more the length of one side of the light emitting diode 200. With this structure, a contact area between the first electrode 140 and the first conductive-type semiconductor layer 111 can be increased such that electric current flowing from the first electrode 140 to the first conductive-type semiconductor layer 111 can be more efficiently spread, thereby further reducing forward voltage.

The first contact region $R_1$ and the second contact region $R_2$ may be formed by photolithography and etching. For example, an etching region is defined using a photoresist, and the first contact region $R_1$ and the second contact region $R_2$ may be formed by etching the second conductive-type semiconductor layer 113 and the active layer 112 using a dry etching process such as ICP.

The second electrode 120 is disposed on the second conductive-type semiconductor layer 113 and may be electrically connected to the second conductive-type semiconductor layer 113. The second electrode 120 is formed on the mesa M and may have the same shape as the mesa M. The second electrode 120 may include a reflective metal layer 121 and may further include a barrier metal layer 122, which covers an upper surface and a side surface of the reflective metal layer 121. For example, the barrier metal layer 122 may be formed to cover the upper surface and the side surface of the reflective metal layer 121 by forming a pattern of the reflective metal layer 121 and then forming the barrier metal layer 122 thereon. For example, the reflective metal layer 121 may be formed by deposition and patterning of Ag, Ag alloy, Ni/Ag, NiZn/Ag, or TiO/Ag layer. In some implementations, the barrier metal layer 122 may be formed of or include Ni, Cr, Ti, Pt, or Au or combinations thereof, specifically, a combination layer formed of or including Ni/Ag/[Ni/Ti]$^2$/Au/Ti sequentially stacked on an upper surface of the second conductive-type semiconductor layer 113. In some implementations, at least a portion of the upper surface of the second electrode 120 may include a 300 Å thick Ti layer. With the structure wherein the upper surface of the second electrode 120 contacting the first insulation layer is composed of or includes the Ti layer, the light emitting diode 200 has improved bonding strength between the second electrode 120 and the first insulation layer 130 described below, thereby providing improved reliability. The reflective metal layer 121 prevents diffusion or contamination of a metallic material. Furthermore, the second electrode 120 may include a transparent conductive layer such as indium tin oxide (ITO), zinc oxide (ZnO), and the like. ITO is composed of or includes a metal oxide having high light transmittance and thus can improve luminous efficacy by suppressing absorption of light by the second electrode 120. An electrode protective layer 160 may be disposed on the second electrode 120. As described above with reference to FIG. 15 and FIG. 16, the electrode protective layer 160 may be formed of or include the same material as the first electrode 140, without being limited thereto.

The first insulation layer 130 may be disposed between the first electrode 140 and the mesa M. The first electrode 140 may be insulated from the mesa M through the first insulation layer 130, and the first electrode 140 may be insulated from the second electrode 120. The first insulation layer 130 may partially expose the first contact region $R_1$ and the second contact region $R_2$. Specifically, the first insulation layer 130 may have an opening 130a, through which the second contact region $R_2$ is partially exposed, and may cover only a portion of the first contact region $R_1$ between the outer periphery of the first conductive-type semiconductor layer 111 and the mesa M such that at least a portion of the first contact region $R_1$ is exposed. Referring to FIG. 15 and FIG. 16, the first insulation layer 130 may be disposed along the outer periphery of the second contact region $R_2$. At the same time, the first insulation layer 130 may be restrictively disposed close to the mesa M to be positioned more inward than an adjoining region between the first contact region $R_1$ and the first electrode 140. Specifically, the first insulation layer 130 may be restrictively disposed more inside the light emitting diode 200 rather than the adjoining region between the first contact region $R_1$ and the first electrode 140. With this structure, the light emitting diode can have an increased contact area between the first electrode 140 and the first conductive-type semiconductor layer 111 without decreasing a light emitting area. Furthermore, in a process of dicing light emitting diodes 200 on a wafer into individual light emitting diodes 200, the first insulation layer 130 disposed along the outer periphery of the first conductive-type semiconductor layer 111 can be prevented from cracking. Accordingly, it is possible to prevent delamination force of the first electrode 140 or a second insulation layer 150 described below from weakening due to infiltration of moisture or contaminants through cracks, and to prevent contamination of the first electrode, thereby improving reliability of the light emitting diode 200. The first insulation layer 130 may have an opening 130b exposing the second electrode 120 described below. The second electrode 120 may be electrically connected to a pad or bump through the opening 130b.

As shown in FIG. 18, the first insulation layer 130 may include a preliminary insulation layer 131 and a main insulation layer 132.

The preliminary insulation layer 131 may be formed on the upper surface of the mesa (m) and the first conductive-type semiconductor layer 111 so as to cover at least a region in which the second electrode 120 will be formed and at least a portion of an exposed region of the first conductive-type semiconductor layer 111. Furthermore, the preliminary insulation layer 131 may further cover the side surface of the mesa M and may partially cover the upper surfaces of the mesas M. The preliminary insulation layer 131 may contact the second electrode 120 or may be separated therefrom. In the structure wherein the preliminary insulation layer 131 is separated from the second electrode 120, the second conductive-type semiconductor layer 113 may be partially exposed between the preliminary insulation layer 131 and the second electrode 120. The preliminary insulation layer 131 may include $SiO_2$, SiNx, or $MgF_2$, and the like. Further, the preliminary insulation layer 131 may include multiple layers, or a distributed Bragg reflector in which materials having different indices of refraction are alternately stacked one above another.

In some implementations, the preliminary insulation layer 131 may be formed before formation of the second electrode 120, after formation of the second electrode 120, or during formation of the second electrode 120. For example, when the second electrode 120 includes a conductive oxide layer and a reflective layer disposed on the conductive oxide layer and including a metal, the preliminary insulation layer 131 may be formed after formation of the conductive oxide layer on the second conductive-type semiconductor layer 225 and before formation of the reflective layer. At this time, the conductive oxide layer forms ohmic contact with the second conductive-type semiconductor layer 225 and the preliminary insulation layer 131 may be formed to a thickness of 400 Å to 2000 Å. In other implementations, the preliminary insulation layer 131 may be formed before formation of the second electrode 120. In these implementations, the second electrode 120 forms ohmic contact with the second conductive-type semiconductor layer 113 and may include a reflective layer formed of or including a metallic material. In these implementations, since the preliminary insulation layer 131 is formed before formation of the reflective layer including a metallic material, it is possible to prevent reduction in reflectivity of the reflective layer and increase in resistance due to interdiffusion of materials between the reflective layer and a light emitting structure 220. Furthermore, it is possible to prevent short circuit due to remaining materials on a portion at which the second electrode 120 is not formed during formation of the reflective layer including a metallic material.

The main insulation layer 132 may be disposed to cover the preliminary insulation layer 131. The main insulation layer 132 may be formed by a suitable deposition method such as PECVD, or e-beam evaporation, and the like. The main insulation layer 132 may be formed in a shape as shown in FIG. 12 through patterning after being formed to cover the entirety of the first conductive-type semiconductor layer 111, the mesa M and the second electrode 120. Patterning may include photolithographic etching or lift-off. The main insulation layer 132 may include $SiO_2$, SiNx, or $MgF_2$, and the like. Furthermore, the main insulation layer 132 may include multiple layers, or a distributed Bragg reflector in which materials having different indices of refraction are alternately stacked one above another. Further, the main insulation layer 132 may be thicker than the preliminary insulation layer 131, and may have a thickness of, for example, 1,000 Å to 18,000 Å.

As described above, the first insulation layer 130 may be formed in a shape as shown in FIG. 15 to FIG. 18 by etching. At this time, during etching, a portion of the upper surface of the second electrode 120 is removed such that the second electrode 120 has a reduced thickness. Specifically, the surface of the second electrode 120 exposed through the opening 130b of the first insulation layer 130 can be removed to a predetermined thickness by etching. More specifically, the Ti layer including the exposed surface of the second electrode 120 can be removed by etching. Accordingly, an adjoining region between the upper surface of the second electrode 120 and the first insulation layer 130 can maintain good bonding strength through the remaining Ti layer, which is not removed and corresponds to a portion of the upper surface of the second electrode 120 contacting the first insulation layer 130. At the same time, in other regions of the second electrode 120 to which external current is applied, connection resistance can be lowered due to removal of the Ti layer, whereby the light emitting diode can have a reduced forward voltage.

After the first insulation layer 130 is formed in a shape as shown in FIG. 15 to FIG. 18 by etching, the exposed upper surface of the first conductive-type semiconductor layer 111 may be additionally etched. Specifically, after formation of the main insulation layer 132, regions of the first contact region $R_1$ and the second contact region $R_2$ not covered by the first insulation layer 130 may be etched. Accordingly, a portion of the first conductive-type semiconductor layer 111 not disposed under the first insulation layer 130 may have a smaller thickness than a portion of the first conductive-type semiconductor layer 111 disposed under the first insulation layer 130. Furthermore, particles derived from inert gas such as $CF_4$ and the like used in etching of the first insulation layer 130 and remaining on the exposed region of the first conductive-type semiconductor layer 111 can be removed. Accordingly, bonding strength between the first electrode 140 and the first conductive-type semiconductor layer 111 can be improved and contact resistance between the first electrode 140 and the first conductive-type semiconductor layer 111 can be reduced.

Referring to FIG. 18, since the preliminary insulation layer 131 is not disposed on the second electrode 120 and extends from the upper surface of the second conductive-type semiconductor layer 113 to cover a portion of the upper surface of the first conductive-type semiconductor layer 111, thickness $130T_1$ of the first insulation layer 130 disposed on the upper surface of the second electrode 120 may be smaller than thickness $130T_2$ of the first insulation layer 130 disposed on the upper surface of the second conductive-type semiconductor layer 113. Further, the thickness $130T_2$ of the first insulation layer 130 disposed on the upper surface of the second conductive-type semiconductor layer 113 may be the same as thickness $130T_3$ of the first insulation layer 130 disposed on the upper surface of the first conductive-type semiconductor layer 111. Accordingly, with the structure wherein the first insulation layer 130 can cover the side surface of the mesa M without decreasing the thickness thereof, the light emitting diode can prevent infiltration of external contaminants while preventing damage to the first insulation layer 130 on the side surface of the mesa M.

The first electrode 140 may be disposed on the first insulation layer 130. Specifically, the first electrode 140 may cover most of the first insulation layer 130. The first electrode 140 may adjoin at least a portion of the first contact region $R_1$ and at least a portion of the second contact region $R_2$. With this structure, the first electrode 140 can be electrically connected to the first conductive-type semiconductor layer 111. The first electrode 140 may expose an outer periphery of the first contact region $R_1$. Referring to FIG. 15 and FIG. 16, the adjoining region between the first contact region $R_1$ and the first electrode 140 may be disposed closer to the mesa M than the adjoining region between the first contact region $R_1$ and the second insulation layer 150 described below. Specifically, the adjoining region between the first contact region $R_1$ and the first electrode 140 may be disposed further inside the light emitting diode 200 than the adjoining region between the first contact region $R_1$ and the second insulation layer 150 described below. In this structure, since the first electrode 140 is not exposed from a side surface of the light emitting diode 200, the first electrode 140 can be effectively protected from external moisture and the like. Furthermore, the first electrode 140 may adjoin a portion of the second contact region $R_2$ and an interface between the first electrode 140 and the second contact region $R_2$ may be a linear plane.

A first linewidth $L_1$, which is a linewidth of the adjoining region between the first contact region $R_1$ and the first electrode 140, may be greater than a second linewidth $L_2$, which is a linewidth of the adjoining region between the second contact region $R_2$ and the first electrode 140. In this structure, a contact area between the first electrode 140 and the first conductive-type semiconductor layer 111 through the first contact region $R_1$ is relatively increased and the light emitting diode 200 can have a reduced forward voltage. Furthermore, the light emitting diode allows more efficient current spreading in the horizontal direction, thereby improving luminous efficacy. Specifically, the first linewidth $L_1$ may be greater than 10 μm and the second linewidth $L_2$ may be 10 μm or less. For example, the first linewidth $L_1$ may be 11 μm and the second linewidth L2 may be 10 μm.

As shown in the drawings, the first electrode 140 may be disposed on the second electrode 120 described below through the opening 130b, as in one example of the electrode protective layer 160. At the same time, the first electrode 140 contacting the first contact region $R_1$ and the second contact region $R_2$ may be electrically insulated from the electrode protective layer 160 on the second electrode 120 by the second insulation layer 150 described below. In this structure, when solders composed of AuSn or the like are used for electrical connection, the first electrode 140 can prevent the solders from diffusing into the second electrode 120 and a step between the first electrode 140 and the second electrode 120 can be reduced, thereby allowing the light emitting diode 200 to be more stably attached to a circuit member such as a printed circuit board.

The first electrode 140 may include a highly reflective metal layer such as an Al layer, and the highly reflective metal layer may be formed on a bonding layer such as a Ti, Cr or Ni layer. Furthermore, a protective layer composed of or including a single layer or multiple layers of Ni, Cr, or Au, and the like may be formed on the highly reflective metal layer. The first electrode 140 may have a multilayer structure of, for example, Cr/Ti/Al/Ti/Ni/Au. Specifically, the first electrode 140 may be or include a laminate layer of Cr/Al/[Ti/Ni]$^2$/Ti/Ni/Au/Ti sequentially stacked on the first conductive-type semiconductor layer 111. More specifically, an upper surface of the first electrode 140 may include a 100 Å thick Ti layer. With the structure wherein the upper surface of the first electrode 140 is composed of or including the Ti layer, the light emitting diode 200 can have improved bonding strength between the first electrode 140 and the second insulation layer 150 described below, thereby providing improved reliability. The first electrode 140 may be formed through deposition and patterning of a metallic material.

The second insulation layer 150 may adjoin a portion of the first contact region $R_1$. Specifically, the second insulation layer 150 may cover a portion of the first contact region $R_1$ exposed through the first electrode 140. Further, the second insulation layer 150 may cover at least a portion of the first electrode 140. The second insulation layer 150 may have an opening 150a exposing the first electrode 140 and an opening 150b exposing the second electrode 120 described below. In the structure wherein the light emitting diode 200 includes the electrode protective layer 160, the second insulation layer 150 may be interposed between the first electrode 140 and the electrode protective layer 160. Accordingly, insulation between the first electrode 140 and the electrode protective layer 160 can be further secured. The second insulation layer 150 may be formed by depositing an oxide insulation layer, a nitride insulation layer, or a polymer such as polyimide, Teflon® or Parylene on the first electrode 140, followed by patterning.

The second insulation layer 150 may be formed by a suitable deposition method such as PECVD, or e-beam evaporation, and the like. The second insulation layer 150 may be formed in a shape as shown in FIG. 15 to FIG. 18 through patterning after being formed to cover the entirety of the first conductive-type semiconductor layer 111 and the first electrode 140. Patterning may include photolithographic etching or lift-off.

During patterning of the second insulation layer 150, a portion of the upper surface of the first electrode 140 is removed such that the first electrode 140 has a reduced thickness. Specifically, the surface of the first electrode 140 exposed through the openings 150*a*, 150*b* of the second insulation layer 150 can be removed to a predetermined thickness by etching. More specifically, the Ti layer including the exposed surface of the second electrode 140 can be removed by etching. Accordingly, an adjoining region between the upper surface of the first electrode 140 and the second insulation layer 150 can maintain good bonding strength through the remaining Ti layer, which is not removed and corresponds to a portion of the upper surface of the first electrode 140 contacting the second insulation layer 150. At the same time, in other regions of the first electrode 140 connected to an external electrode via solders and the like, connection resistance can be lowered due to removal of the Ti layer, whereby the light emitting diode can have a reduced forward voltage. The second insulation layer 150 may cover an overall area of a side surface of the first conductive-type semiconductor layer 111 and a portion of a side surface of the growth substrate 101. With this structure, the light emitting diode 200 can protect the first conductive-type semiconductor layer 111 from external moisture or impact and can prevent an interface between the growth substrate 101 and the first conductive-type semiconductor layer 111 from splitting, thereby providing improved reliability.

The second insulation layer 150 may cover at least a portion of the slanted side surface of the growth substrate 101. With this structure, the second insulation layer 150 can be effectively attached to the growth substrate 101, thereby increasing delamination force while improving reliability of the light emitting diode 200. The slanted surface may be formed in the course of allowing a laser beam to enter the growth substrate in the process of dicing a wafer into individual light emitting diodes 200.

Figure 19:
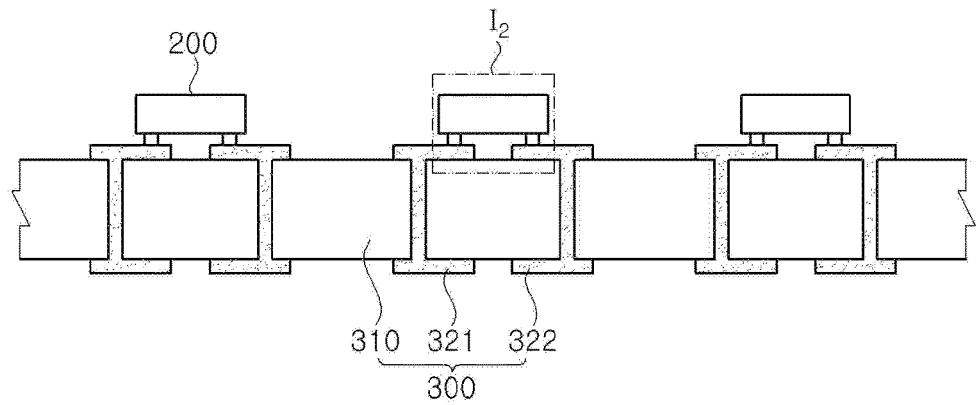
FIG. 19 is a sectional view of a light emitting diode in accordance with an embodiment of the disclosed technology and a circuit member on which the light emitting diode is mounted.
Figure 20:
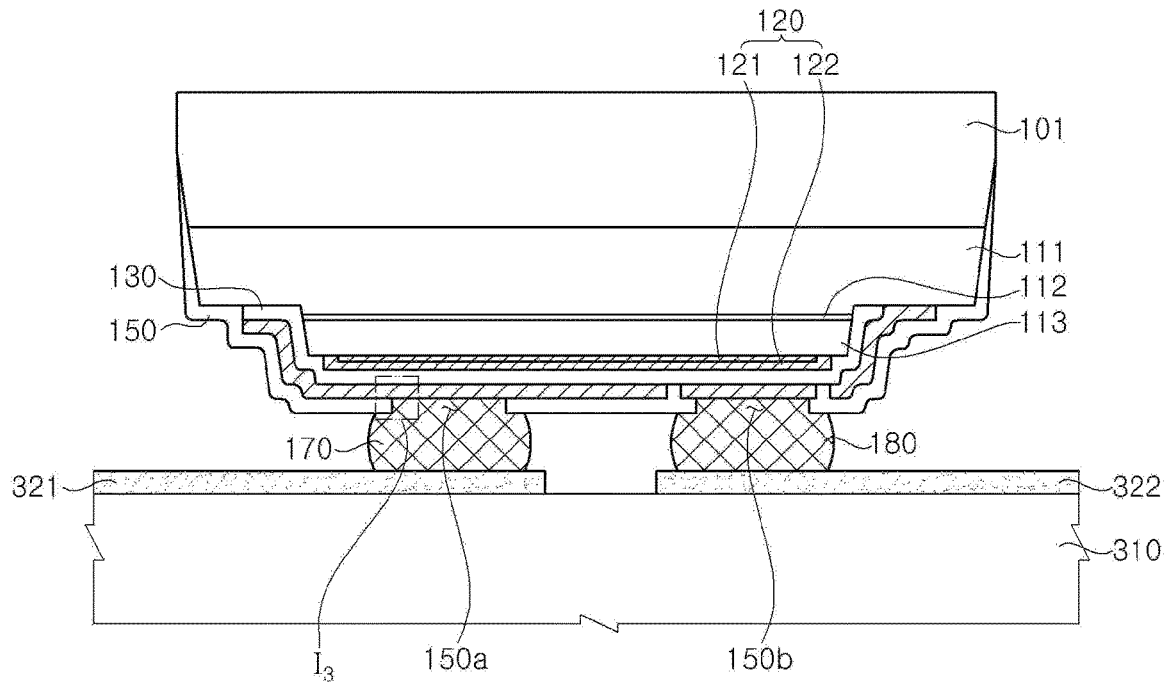
FIG. 20 is an enlarged sectional view of part 12 of FIG. 19.
Figure 21:
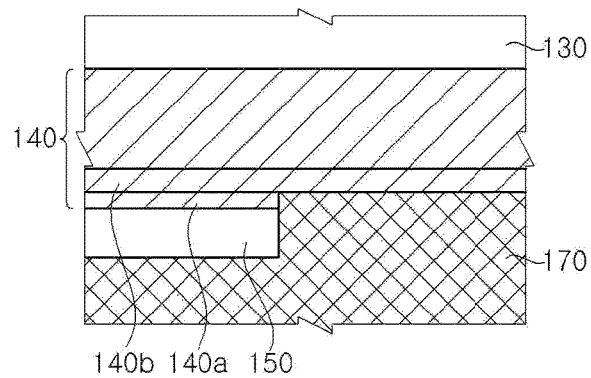
FIG. 21 is an enlarged sectional view of part 13 of FIG. 20.
Figure 22:
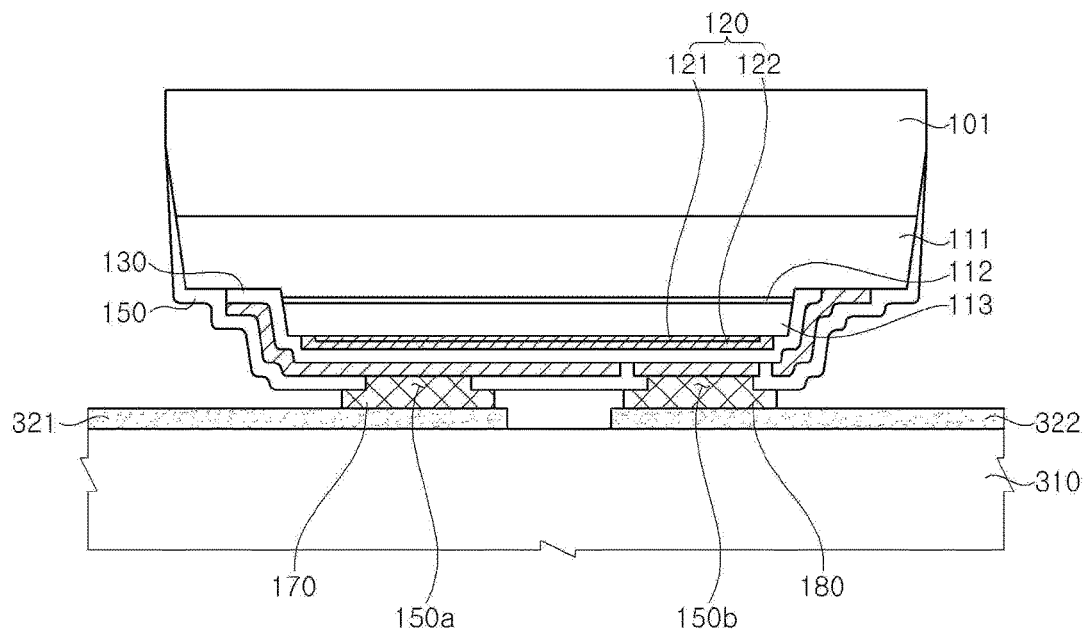
FIG. 22 is a sectional view illustrating a structure wherein the light emitting diode in accordance with an embodiment of the disclosed technology is mounted on a circuit member.

FIG. 19 is a sectional view of a light emitting diode in accordance with an embodiment of the disclosed technology and a circuit member on which the light emitting diode is mounted, FIG. 20 is an enlarged sectional view of part 12 of FIG. 19, FIG. 21 is an enlarged sectional view of part 13 of FIG. 20, and FIG. 22 is a sectional view illustrating a structure wherein the light emitting diode in accordance with an embodiment of the disclosed technology is mounted on a circuit member.

Referring to FIG. 19, a plurality of light emitting diodes 200 may be mounted on a circuit member 300 and may be used as a single module. The circuit member 300 may include a printed circuit board (PCB), without being limited thereto. As shown in FIG. 19, the circuit member 300 may include a base 310 and interconnection lines 321 and 322, but is not limited to the shape shown in FIG. 19.

Referring to FIG. 20, the light emitting diode 200 may be mounted on the circuit member through pads 170 and 180. Specifically, the pads 170 and 180 may be interposed between the light emitting diode 200 and the interconnection lines 321 and 322 of the circuit member. The pads 170 and 180 may include solders or a eutectic metal, without being limited thereto. Specifically, AuSn may be used as the eutectic metal.

Additionally referring to FIG. 21, the pads 170 and 180 may contact the first electrode 140 and the second electrode 120, respectively or if the electrode protective layer 160 is disposed on the second electrode 120, the pads 170 and 180 may contact the first electrode 140 and the electrode protective layer 160, respectively. Since the Ti layer 140*a* exposed through the first electrode 140 and the second electrode 120 is removed by etching upon formation of the first insulation layer 130 and the second insulation layer 150, the pads 170 and 180 can contact the first electrode 140 and the second electrode 120, respectively, from which the Ti layer 140*a* is removed. Specifically, since the Ti layer 140*a* is removed from the first electrode 140 and the second electrode 120, an Au layer 140*b* can be exposed to contact the pads 170 and 180. Further, in the structure wherein the electrode protective layer 160 is disposed on the second electrode 120 and is formed of or includes the same material as the first electrode 140, the Ti layer of the electrode protective layer 160 may also be removed, such that the exposed Au layer contacts the pad 180.

Referring to FIG. 22, the pads 170 and 180 may include a eutectic metal. In this implementation, the pads 170 and 180 may be formed of or include an Au-containing material, for example, AuSn. Accordingly, since Au components of the pads 170 and 180 can contact the first electrode 140 and the second electrode 120, or the first electrode 140 and the Au layer of the electrode protective layer 160, bonding strength between the light emitting diode 200 and the pads 170, 180 can be increased. Accordingly, the circuit member having the light emitting diode 200 mounted thereon can have improved reliability.

Figure 23:
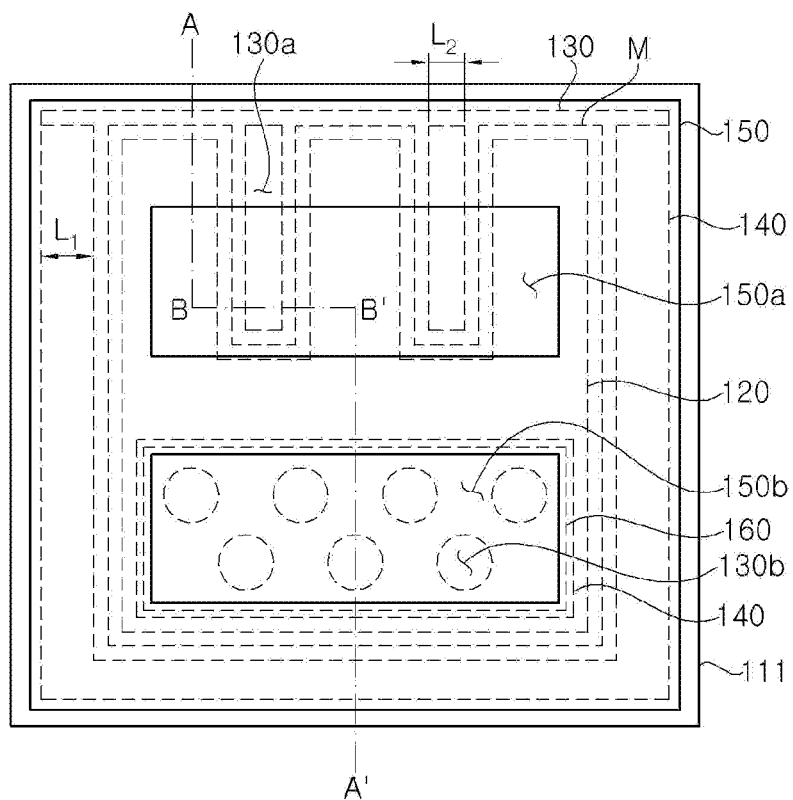
FIG. 23 is a plan view of a light emitting diode in accordance with an embodiment of the disclosed technology.
Figure 24:
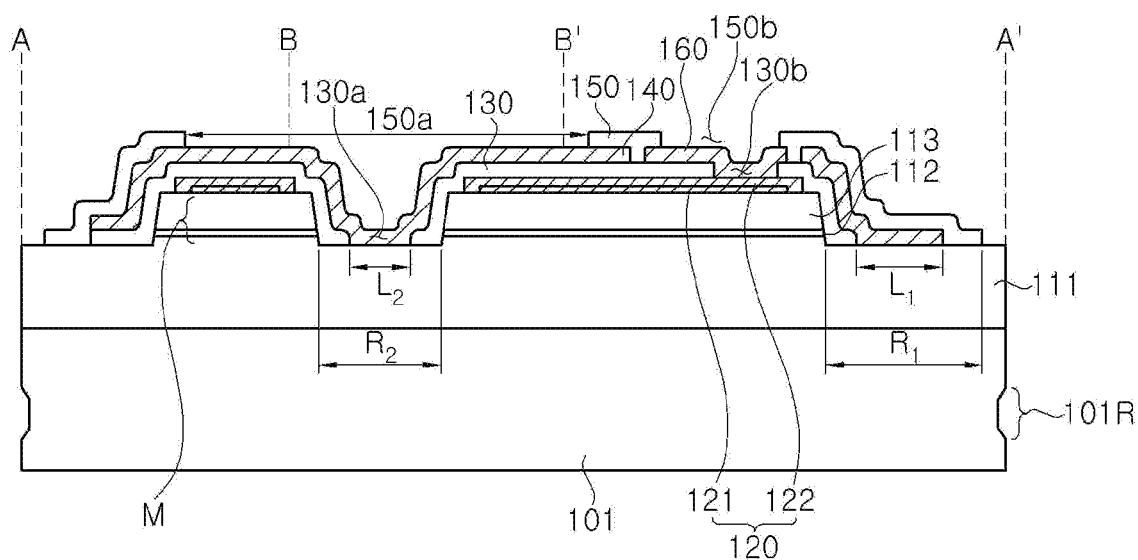
FIG. 24 is a cross-sectional view taken along line A-B-B'-A' of FIG. 23.
Figure 25:
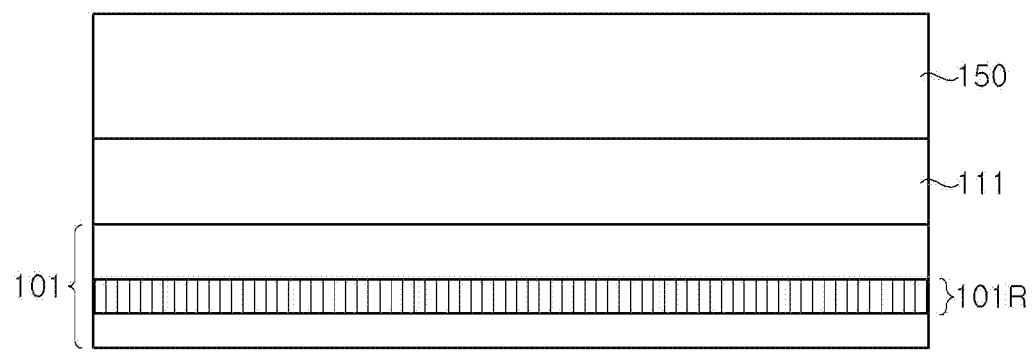
FIG. 25 is a side view of the light emitting diode of FIG. 23.

FIG. 23 is a plan view of a light emitting diode 201 in accordance with an embodiment of the disclosed technology, FIG. 24 is a cross-sectional view taken along line A-B-B'-A' of FIG. 23, and FIG. 25 is a side view of the light emitting diode 201 of FIG. 23. The light emitting diode 201 shown in FIG. 23 is similar to the light emitting diode 200 described with reference to FIG. 15 to FIG. 18 except that the light emitting diode 201 includes a second insulation layer 150 separated from an outer periphery of a first conductive-type semiconductor layer 111 and a growth substrate 101 includes at least one reformed region 101R.

Specifically, the growth substrate 101 may include at least one reformed region 101R that extends from at least one side surface of the growth substrate 101 in the horizontal direction and has a stripe shape. The reformed region 101R may be formed in the process of providing individual light emitting diodes through division of the growth substrate 101. For example, the reformed region 101R may be formed through internal machining of the growth substrate. A scribing plane may be formed inside the growth substrate 101 by internal laser machining. At this time, a distance from the reformed region 101R to a lower surface of the growth substrate 101 may be smaller than a distance from the reformed region 101R to an upper surface of the growth substrate 101. Considering light emitted through the side surface of the light emitting diode 201, laser machining is performed mainly with respect to a lower side of the growth substrate 101 such that the reformed region 101R is formed relatively close to the lower side thereof, thereby improving efficiency in extraction of light generated from the active layer 112. Furthermore, when the reformed region 101R is formed near the first conductive-type semiconductor layer 111, there can be a problem in terms of electrical characteristics due to damage to a nitride semiconductor during laser machining. Accordingly, with the structure wherein the reformed region 101R is formed relatively close to the lower side of the growth substrate 101, it is possible to prevent deterioration in reliability and luminous efficacy of the light emitting diode 201 due to damage to the nitride-based semiconductor.

The second insulation layer 150 may be disposed to be separated from the outer periphery of the first conductive-type semiconductor layer 111. Specifically, the second insulation layer 150 may be disposed in other regions excluding the side surface of the first conductive-type semiconductor layer 111 and the side surface of the growth substrate 101, and may be separated a predetermined distance from the outer periphery of the first conductive-type semiconductor layer 111. Accordingly, it is possible to prevent damage to the first insulation layer 150 due to stress applied to interfaces between individual light emitting diodes during the process of providing the individual light emitting diodes through division of the growth substrate 101.

Figure 26:
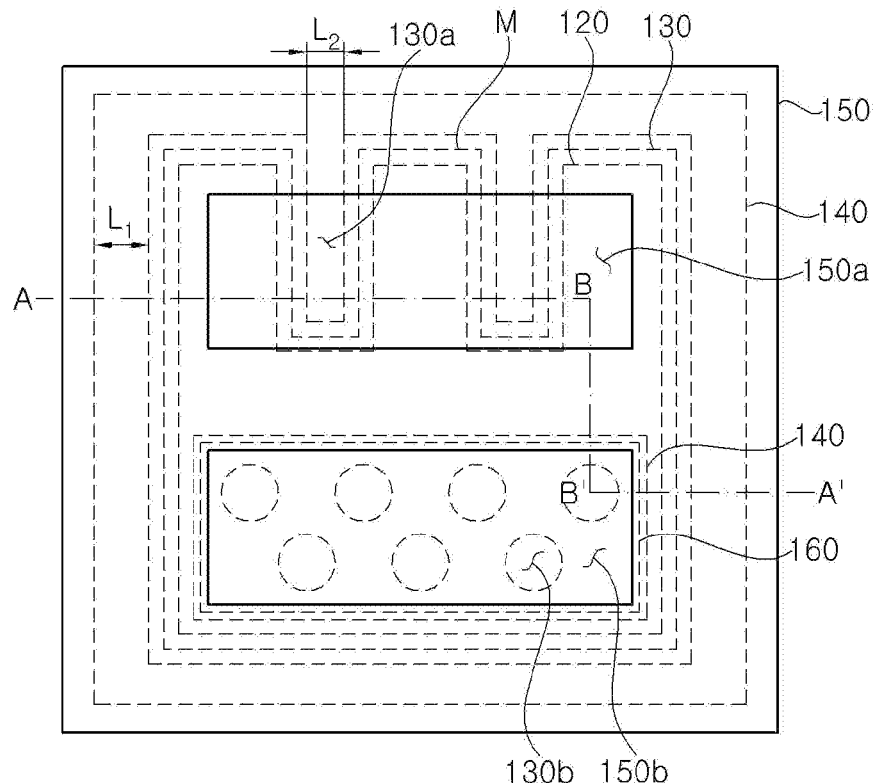
FIG. 26 is a plan view of a light emitting diode in accordance with an embodiment of the disclosed technology.
Figure 27:
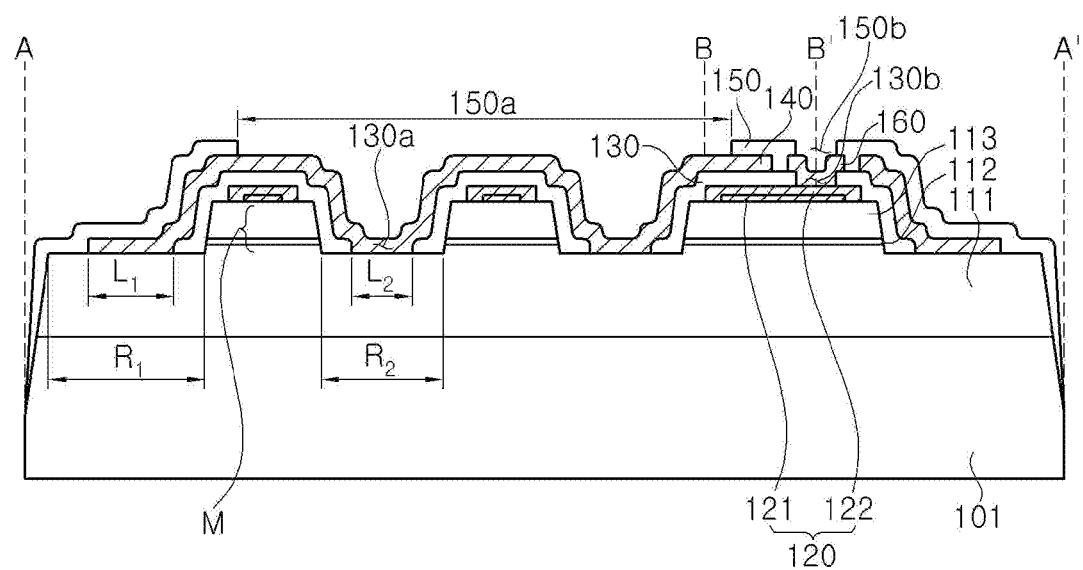
FIG. 27 is a cross-sectional view taken along line A-B-B'-A' of FIG. 26.

FIG. 26 is a plan view of a light emitting diode 202 in accordance with an embodiment of the disclosed technology and FIG. 27 is a cross-sectional view taken along line A-B-B'-A' of FIG. 26.

The light emitting diode 202 shown in FIG. 26 and FIG. 27 is similar to the light emitting diode 200 described with reference to FIG. 15 and FIG. 16 except that the adjoining region between the first contact region $R_1$ and the first electrode 140 is disposed along the outer periphery of the overall upper surface of the first conductive-type semiconductor layer. Specifically, the adjoining region between the first contact region $R_1$ and the first electrode 140 may be disposed near all four side surfaces of the first conductive-type semiconductor layer 111 and may completely surround the mesa M. In this embodiment, a contact area between the first electrode 140 and the first conductive-type semiconductor layer 111 can be increased such that electric current flowing from the first electrode 140 to the first conductive-type semiconductor layer 111 can be more efficiently spread, thereby further reducing forward voltage.

Figure 28:
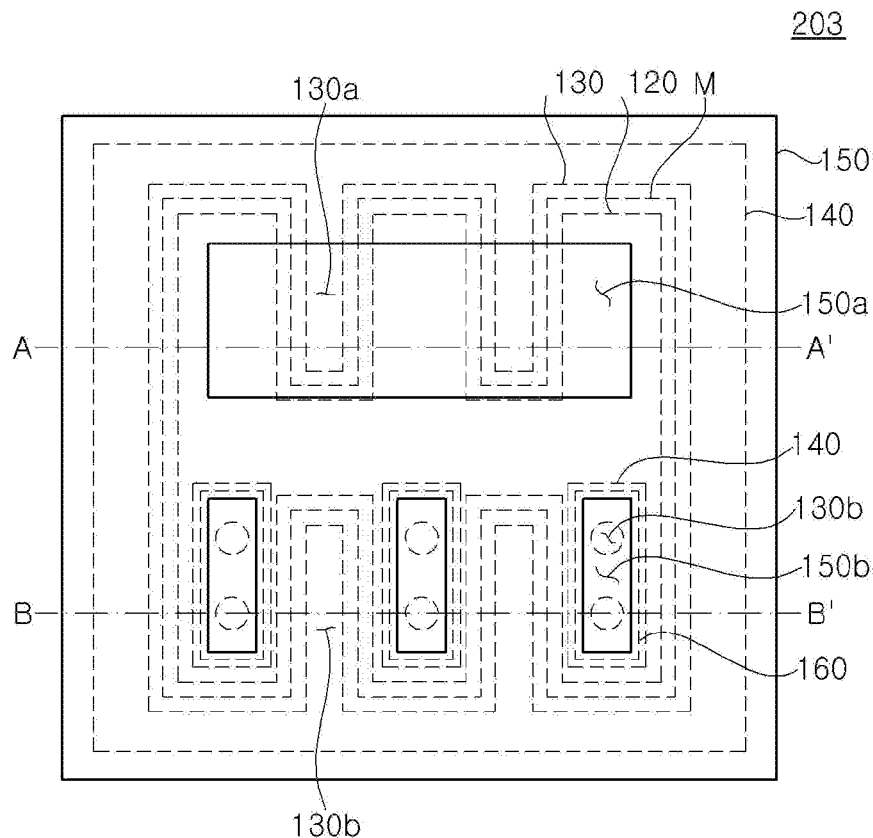
FIG. 28 is a plan view of a light emitting diode in accordance with an embodiment of the disclosed technology.
Figure 29:
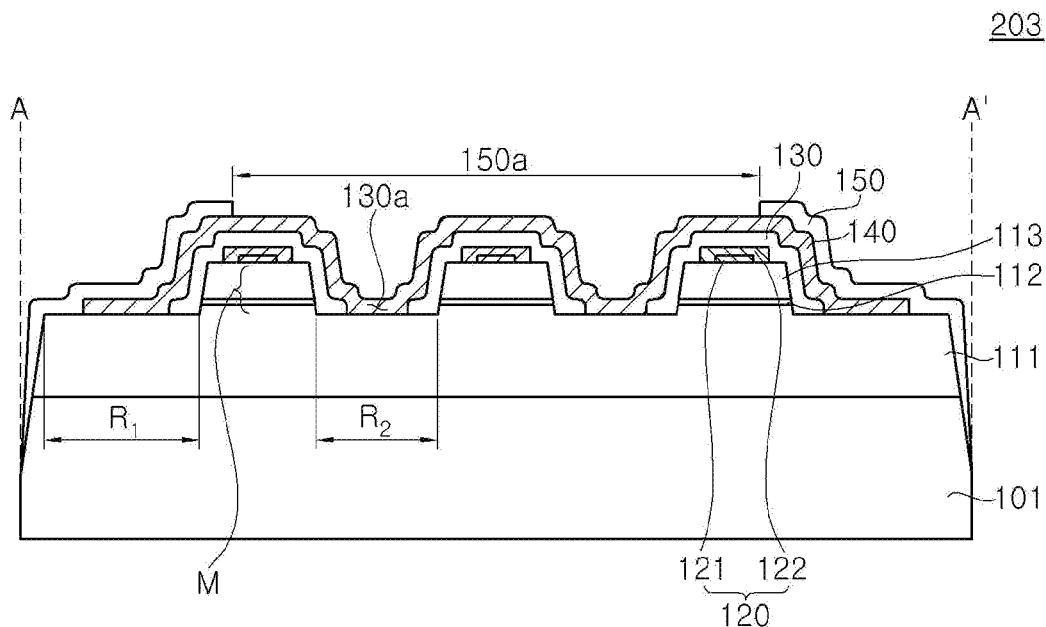
FIG. 29 is a cross-sectional view taken along line A-A' of FIG. 28.
Figure 30:
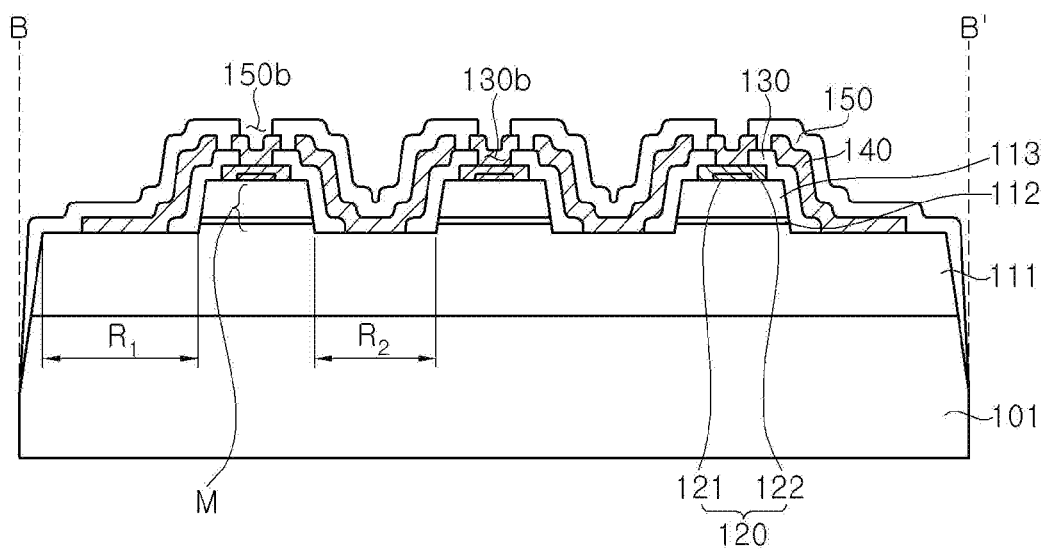
FIG. 30 is a cross-sectional view taken along line B-B' of FIG. 28.

FIG. 28 is a plan view of a light emitting diode 203 in accordance with an embodiment of the disclosed technology, FIG. 29 is a cross-sectional view taken along line A-A' of FIG. 28, and FIG. 30 is a cross-sectional view taken along line B-B' of FIG. 28.

The light emitting diode 203 shown in FIG. 28 to FIG. 30 is similar to the light emitting diode 200 described with reference to FIG. 15 and FIG. 16 excluding the shape of the mesa M.

Specifically, the mesa M of the light emitting diode 200 shown in FIG. 15 and FIG. 16 includes the plurality of protrusions protruding towards one side surface of the light emitting diode 200 by way of example. On the contrary, the light emitting diode 203 shown in FIG. 28 to FIG. 30 may include not only a plurality of protrusions protruding towards one side of the first conductive-type semiconductor layer 111 but also a plurality of protrusions protruding towards the other side thereof.

Accordingly, a second contact region $R_2$ partially surrounded by the mesa M can be increased. That is, it is possible to secure the second contact region $R_2$ disposed between the pluralities of protrusions protruding towards the one side of the first conductive-type semiconductor layer 111 and the other sides thereof. With this structure, not only in a region near the one side of the first conductive-type semiconductor layer 111 but also in a region near the other side thereof, efficient current movement can be achieved between the second electrode 120 on the protrusions and the first electrode 140 on the second contact region $R_2$. Accordingly, light emission from the region adjacent the other side can be improved.

Figure 31:
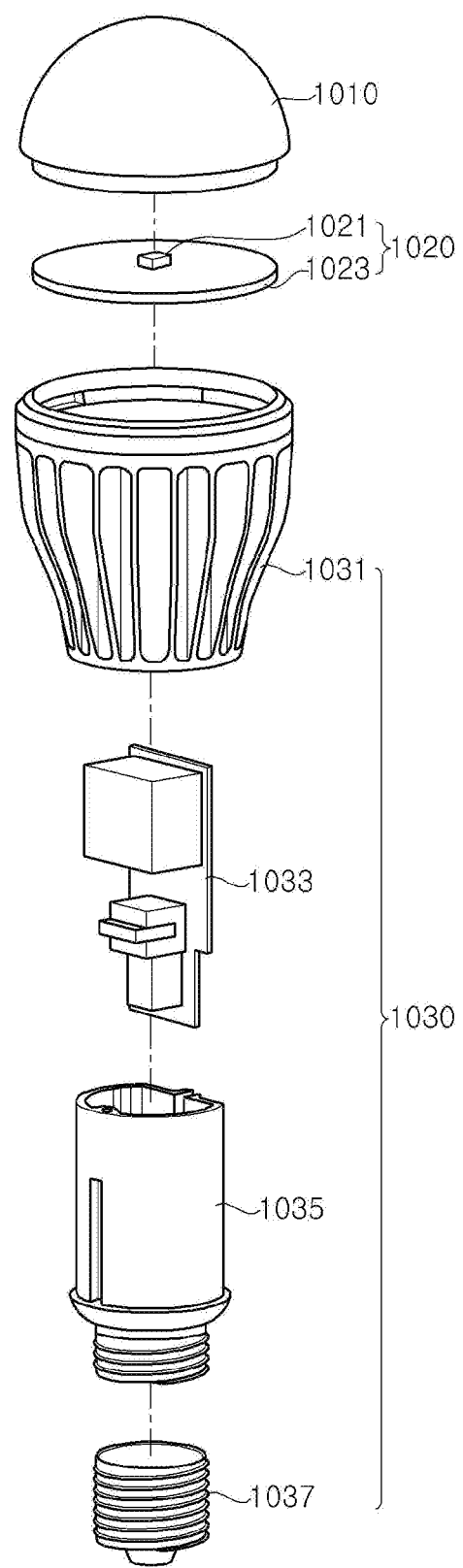
FIG. 31 is an exploded perspective view of an exemplary lighting apparatus to which a light emitting diode in accordance with an embodiment of the disclosed technology is applied.

FIG. 31 is an exploded perspective view of an exemplary lighting apparatus to which a light emitting diode in accordance with an embodiment of the disclosed technology is applied.

Referring to FIG. 31, the lighting apparatus according to this embodiment includes a diffusive cover 1010, a light emitting diode module 1020, and a body 1030. The body 1030 may receive the light emitting diode module 1020 and the diffusive cover 1010 may be disposed on the body 1030 to cover an upper portion of the light emitting diode module 1020.

The body 1030 may have any structure so long as the body can receive and support the light emitting diode module 1020 to supply electric power to the light emitting diode module 1020. For example, the body 1030 may include a body case 1031, a power supply 1033, a power source case 1035, and a power connector 1037, as shown in FIG. 31.

The power supply 1033 is received in the power source case 1035 to be electrically connected to the light emitting diode module 1020 and may include at least one integrated circuit (IC) chip. The IC chip can regulate, change or control characteristics of power supplied to the light emitting diode module 1020. The power source case 1035 may receive and support the power supply 1033, and may be disposed inside the body case 1031, with the power supply 1033 secured inside the power source case 1035. The power connector 115 is provided to a lower end of the power source case 1035 and is coupled to the power source case 1035. With this structure, the power connector 115 is electrically connected to the power supply 1033 inside the power source case 1035 and may act as a passage through which external power can be supplied to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

The substrate 1023 may be selected from any substrate so long as the substrate can support the light emitting diode 1021, and may be or include, for example, a printed circuit board including interconnections. The substrate 1023 may have a shape corresponding to a securing portion at the upper portion of the body case so as to be stably secured to the body case 1031. The light emitting diode 1021 may include at least one of the light emitting diodes according to the above embodiments.

The diffusive cover 1010 is disposed above the light emitting diode 1021 and is secured to the body case 1031 to cover the light emitting diode 1021. The diffusive cover 1010 may be formed of or include a light transmitting material and light orientation characteristics of the lighting apparatus can be regulated through adjustment of the shape and light transmittance of the diffusive cover 1010. Accordingly, the diffusive cover 1010 may be modified in various ways depending upon purposes and applications of the lighting apparatus.

Figure 32:
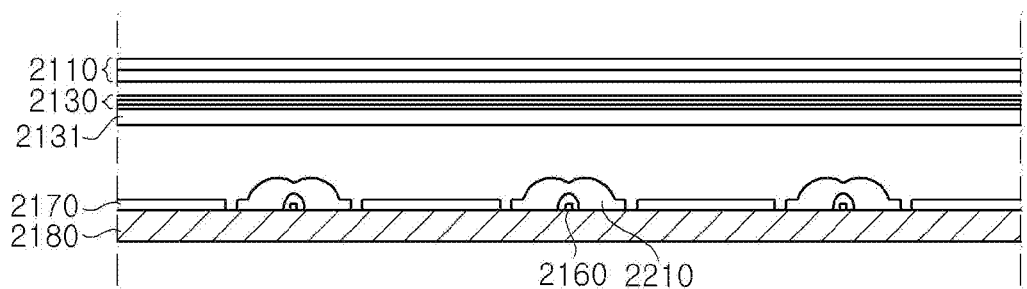
FIG. 32 is a sectional view of an exemplary display to which a light emitting diode in accordance with an embodiment of the disclosed technology is applied.

FIG. 32 is a sectional view of an exemplary display to which a light emitting diode in accordance with an embodiment of the disclosed technology is applied.

The display according to this embodiment includes a display panel 2110, a backlight unit BLU1 supplying light to the display panel 2110, and a panel guide 2100 supporting a lower edge of the display panel 2110.

The display panel 2110 may be, for example, a liquid crystal display panel including a liquid crystal layer, without being limited thereto. The display panel 2110 may be provided at an edge thereof with gate drive PCBs for supplying drive signals to a gate line. In some implementations, the gate drive PCBs 2112 and 2113 may be formed on a thin film transistor substrate instead of a separate PCB.

The backlight unit BLU1 includes a light source module including at least one substrate 2150 and a plurality of light emitting diodes 2160. The backlight unit BLU1 may further include a bottom cover 2180, a diffusive sheet 2170, a diffusive plate 2131, and optical sheets 2130.

The bottom cover 2180 is open at an upper side thereof and may receive the substrate 2150, the light emitting diodes 2160, the diffusive sheet 2170, the diffusive plate 2131 and the optical sheets 2130. In addition, the bottom cover 2180 may be coupled to the panel guide 2100. The substrate 2150 may be disposed at a lower side of the diffusive sheet 2170 to be surrounded by the diffusive sheet 2170. Alternatively, in the structure wherein a surface of the substrate 2150 is coated with a reflective material, the substrate 2150 may be disposed on the diffusive sheet 2170. In some implementations, a plurality of substrates 2150 may be arranged parallel to each other. However, it should be understood that the disclosed technology is not limited thereto and the substrate 2150 may be realized by a single substrate.

The light emitting diodes 2160 may include at least one of the light emitting diodes according to the embodiments described above. The light emitting diodes 2160 may be regularly arranged in a predetermined pattern on the substrate 2150. Furthermore, a lens 2210 is disposed on each of the light emitting diodes 2160, thereby improving uniformity of light emitted from the plurality of light emitting diodes 2160.

The diffusive plate 2131 and the optical sheets 2130 are disposed above the light emitting diodes 2160. Light emitted from the light emitting diodes 2160 may be supplied in the form of surface light to the display panel 2110 through the diffusive plate 2131 and the optical sheets 2130.

As such, the light emitting diodes according to the embodiments of the disclosed technology may be applied to a direct type display as in this embodiment.

Figure 33:
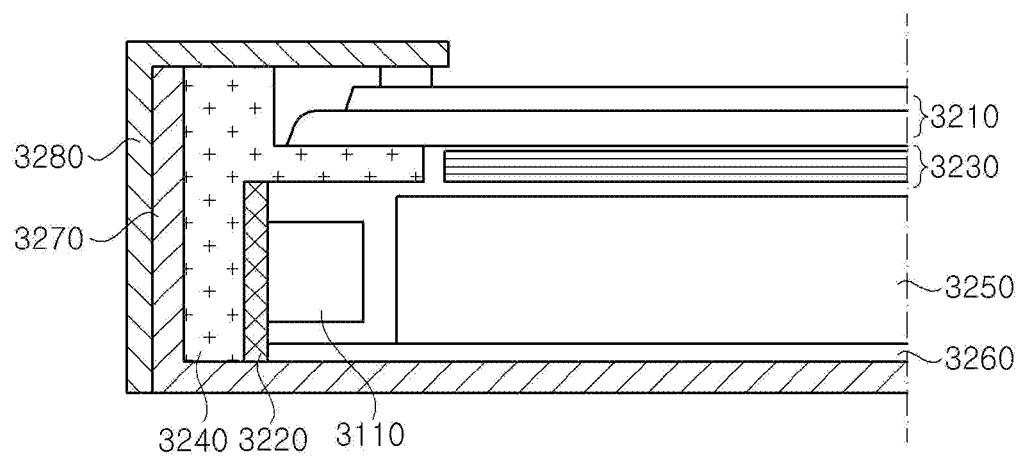
FIG. 33 is a sectional view of an exemplary display to which a light emitting diode in accordance with an embodiment of the disclosed technology is applied.

FIG. 33 is a sectional view of an exemplary display to which a light emitting diode in accordance with an embodiment of the disclosed technology is applied.

A display according to this embodiment includes a display panel 3210 on which an image is displayed, and a backlight unit BLU2 disposed at the backside of the display panel 3210 and supplying light. The display includes a frame 240 supporting the display panel 3210 and receiving the backlight unit BLU2, and covers 3240, 3280 enclosing the display panel 3210.

The display panel 3210 may be, for example, a liquid crystal display panel including a liquid crystal layer, without being limited thereto. The display panel 3210 may be provided at an edge thereof with gate drive PCBs for supplying drive signals to a gate line. In some implementations, the gate drive PCBs may be formed on a thin film transistor substrate instead of a separate PCB. The display panel 3210 is secured by the covers 3240 and 3280 disposed at upper and lower sides thereof, and the cover 3280 disposed at the lower side of the display panel may be coupled to the backlight unit BLU2.

The backlight unit BLU2 configured to supply light to the display panel 3210 includes a lower cover 3270 partially open at an upper side thereof, a light source module disposed at one side within the lower cover 3270 and a light guide plate 3250 disposed parallel to the light source module and converting spot light into surface light. The backlight unit BLU2 according to this embodiment may further include optical sheets 3230 disposed above the light guide plate 3250 to collect and spread light, and a reflective sheet 3260 disposed below the light guide plate 3250 to reflect light, which travels in a downward direction of the light guide plate 3250, towards the display panel 3210.

The light source module includes a substrate 3220 and a plurality of light emitting diodes 3110 arranged at constant intervals on one surface of the substrate 3220. The substrate 3220 may be selected from any substrate so long as the substrate can support the light emitting diodes 3110 and be electrically connected to the light emitting diodes 3110, and may be or include, for example, a printed circuit board. The light emitting diodes 3110 may include at least one of the light emitting diodes according to the embodiments described above. Light emitted from the light source module enters the light guide plate 3250 to be supplied to the display panel 3210 through the optical sheets 3230. Through the light guide plate 3250 and the optical sheets 3230, spot light emitted from the light emitting diodes 3110 can be converted into surface light.

As such, the light emitting diodes according to the embodiments of the disclosed technology may be applied to an edge type display as in this embodiment.

Figure 34:
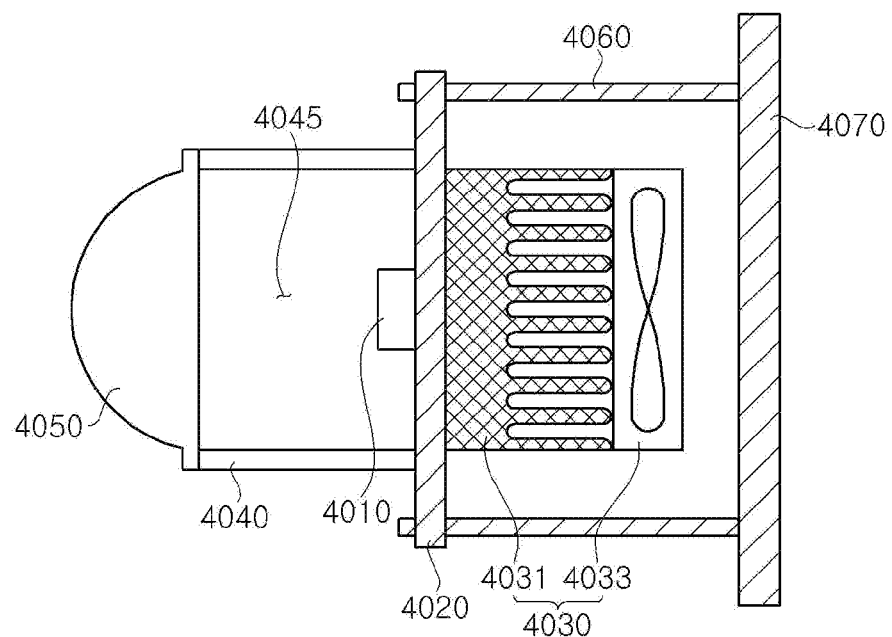
FIG. 34 is a sectional view of an exemplary headlight to which a light emitting diode in accordance with an embodiment of the disclosed technology is applied.

FIG. 34 is a sectional view of an exemplary headlight to which a light emitting diode in accordance with an embodiment of the disclosed technology is applied.

Referring to FIG. 34, the headlight includes a lamp body 4070, a substrate 4020, a light emitting diode 4010, and a cover lens 4050. The headlight may further include a heat dissipation portion 4030, a support rack 4060, and a connection member 4040.

The substrate 4020 is secured by the support rack 4060 and disposed above the lamp body 4070 to be separated therefrom. The substrate 4020 may be selected from any substrate so long as the substrate can support the light emitting diode 4010, and may be or include, for example, a printed circuit board having a conductive pattern. The light emitting diode 4010 is disposed on the substrate 4020 and may be supported and secured by the substrate 4020. Further, the light emitting diode 4010 may be electrically connected to an external power source through the conductive pattern of the substrate 4020. The light emitting diode 4010 may include at least one of the light emitting diodes according to the embodiments described above.

The cover lens 4050 is placed on an optical path along which light emitted from the light emitting diode 4010 travels. For example, as shown in FIG. 34, the cover lens 4050 may be separated from the light emitting diode 4010 by the connection member 4040 and may be disposed in a direction in which light emitted from the light emitting diode 4010 will be supplied. By the cover lens 4050, a beam angle and/or a color of light emitted from the headlight to the outside can be regulated. On the other hand, the connection member 4040 secures the cover lens 4050 to the substrate 4020 and is disposed to surround the light emitting diode 4010 so as to act as a light guide providing a light emission path 4045. Here, the connection member 4040 may be formed of a light reflective material or may be coated with the light reflective material. The heat dissipation portion 4030 may include heat dissipation fins 4031 and/or a heat dissipation fan 4033, and dissipates heat generated during operation of the light emitting diode 4010.

As such, the light emitting diodes according to the embodiments of the disclosed technology may be applied to a headlight as in this embodiment, particularly, to a vehicle headlight.

Although various embodiments have been described above, it should be understood that other implementations are also possible. In addition, some features of a certain embodiment may also be applied to other embodiments in the same or similar ways without departing from the spirit and scope of the disclosed technology.

What is claimed is:

1. A light emitting device comprising: a substrate having a first sidewall, a second sidewall opposite to the first sidewall along a first direction; a first semiconductor layer formed over the substrate; an active layer formed over the first semiconductor layer; a second semiconductor layer formed over the active layer; a first electrode formed over the first semiconductor layer and having first electrode portions extending from the first sidewall toward the second sidewall; and a second electrode formed over the second semiconductor layer and having a connecting portion and second electrode portions extending from the connecting portion toward the first sidewall; wherein one of the first electrode portions and the connecting portion are arranged along the first direction; a first pad electrically contacting the first semiconductor layer through the exposed portion of the first semiconductor layer; and a second pad electrically contacting the second semiconductor layer through the exposed portion of the second semiconductor layer.

2. The light emitting device of claim 1, wherein one of the first electrode portions and one of the second electrode portions are alternately arranged along a second direction different from the first direction.

3. The light emitting device of claim 1, wherein each of the first electrode portions has a sidewall not aligned with a sidewall of the first semiconductor layer.

4. The light emitting device of claim 1, wherein the first electrode and the second electrode electrically contact with the first semiconductor layer and the second semiconductor layer, respectively.

5. The light emitting device of claim 1, further comprising an insulation layer formed over the first semiconductor layer and the second semiconductor layer and structured to expose portions of the first semiconductor layer and the second semiconductor layer.

6. The light emitting device of claim 5, wherein the insulation layer includes a distributed Bragg reflector (DBR).

7. The light emitting device of claim 1, wherein the second electrode includes indium tin oxide (ITO) or an oxide material.

8. The light emitting device of claim 1, wherein the active layer and the second semiconductor layer have sidewalls not aligned with sidewalls of the first semiconductor layer.

9. A light emitting device comprising:
a substrate having a first to fourth side surfaces, the first and second side surfaces parallel to each other along a first direction and the third and fourth side surfaces parallel to each other along a second direction different from the first direction;
a first semiconductor layer formed over the substrate and having side surfaces aligned with the first to fourth side surfaces of the substrate;
a mesa formed over the first semiconductor layer and having side surfaces not aligned with the first to fourth side surfaces of the substrate, the mesa including an active layer and a second semiconductor layer and having different widths along the first direction and the second directions;
an insulation layer formed over the mesas and the first semiconductor layer and structured to expose portions of the first semiconductor layer and the second semiconductor layer;
a first pad electrically contacting the first semiconductor layer through the exposed portion of the first semiconductor layer; and
a second pad electrically contacting the second semiconductor layer through the exposed portion of the second semiconductor layer.

10. The light emitting device of claim 9, wherein a portion of the first semiconductor layer is disposed between portions of the mesa.

11. The light emitting device of claim 9, wherein the mesa includes branches having an elongated shape and disposed parallel to one another and a connecting portion connecting the branches.

12. The light emitting device of claim 9, wherein the mesa includes protrusions protruding toward the second side surface.

13. The light emitting device of claim 9, further comprising:
a first electrode electrically coupled to the first semiconductor layer; and
a second electrode electrically coupled to the second semiconductor layer.

14. The light emitting device of claim 13, wherein the first electrode has a width that varies along the first direction.

15. The light emitting device of claim 13, wherein the second electrode includes indium tin oxide (ITO) or an oxide material.

16. The light emitting device of claim 9, wherein the insulation layer includes a distributed Bragg reflector (DBR).

17. The light emitting device of claim 9, wherein the insulation layer includes multiple layers.

18. The light emitting device of claim 9, further comprising a current spreading layer formed on the insulation layer and covering the mesa and the first semiconductor layer, the current spreading layer contacting the first semiconductor layer through the exposed portion of the first semiconductor layer.

* * * * *